United States Patent
Kandala et al.

(10) Patent No.: US 12,229,634 B2
(45) Date of Patent: Feb. 18, 2025

(54) STARK SHIFT CANCELLATION

(71) Applicant: International Business Machines Corporation, Armonk, NY (US)

(72) Inventors: Abhinav Kandala, Yorktown Heights, NY (US); David C. Mckay, Ossining, NY (US); Srikanth Srinivasan, Mount Kisco, NY (US); Easwar Magesan, Mount Kisco, NY (US); Jay Michael Gambetta, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 734 days.

(21) Appl. No.: 17/526,852

(22) Filed: Nov. 15, 2021

(65) Prior Publication Data
US 2023/0153667 A1    May 18, 2023

(51) Int. Cl.
G06N 10/00     (2022.01)
G06F 15/82     (2006.01)
H10N 60/12     (2023.01)
H10N 60/80     (2023.01)

(52) U.S. Cl.
CPC .......... G06N 10/00 (2019.01); G06F 15/82 (2013.01); H10N 60/12 (2023.02); H10N 60/805 (2023.02)

(58) Field of Classification Search
CPC ..... G06F 15/82; H01L 39/025; H01L 39/223; G06N 10/00
See application file for complete search history.

(56) References Cited

U.S. PATENT DOCUMENTS

| | | | |
|---|---|---|---|
| 5,155,736 A | * | 10/1992 | Ono ................ H01S 5/06255 |
| | | | 372/20 |
| 6,678,450 B1 | | 1/2004 | Franson |
| 9,332,279 B2 | | 5/2016 | Lundberg |
| 9,727,823 B2 | | 8/2017 | Amin et al. |
| 10,347,834 B2 | | 7/2019 | Thomas et al. |

(Continued)

FOREIGN PATENT DOCUMENTS

| CN | 109547786 A | 3/2019 |
|---|---|---|
| CN | 111291891 A | 6/2020 |

(Continued)

OTHER PUBLICATIONS

Examination Report under Section 18(3) received for GB Patent Application Serial No. 2407066.6 dated Jul. 15, 2024, 7 pages.

(Continued)

*Primary Examiner* — Guy J Lamarre
(74) *Attorney, Agent, or Firm* — Amin, Turocy & Watson, LLP

(57) ABSTRACT

Systems and techniques that facilitate Stark shift cancellation are provided. In various embodiments, a system can comprise a control qubit that is coupled to a target qubit. In various cases, the control qubit can be driven by a first tone that entangles the control qubit with the target qubit. In various aspects, the control qubit can be further driven by a second tone simultaneously with the first tone. In various cases, the second tone can have an opposite detuning sign than the first tone. In various instances, the first tone can cause a Stark shift in an operational frequency of the control qubit, and the second tone can cancel the Stark shift.

25 Claims, 11 Drawing Sheets

(56) References Cited

U.S. PATENT DOCUMENTS

| | | | |
|---|---|---|---|
| 10,552,755 B2 | 2/2020 | Anting et al. | |
| 10,755,193 B2 | 8/2020 | Kandala et al. | |
| 11,223,347 B1* | 1/2022 | Mckay | G06N 10/40 |
| 11,875,222 B1 | 1/2024 | Reagor et al. | |
| 2004/0156407 A1 | 8/2004 | Beausoleil et al. | |
| 2004/0223523 A1* | 11/2004 | Zhu | G04F 5/145 372/11 |
| 2009/0310640 A1* | 12/2009 | Sato | H01L 33/32 257/14 |
| 2018/0260732 A1 | 9/2018 | Bloom et al. | |
| 2019/0205784 A1 | 7/2019 | Monroe et al. | |
| 2019/0377955 A1 | 12/2019 | Swaminathan et al. | |
| 2020/0028312 A1* | 1/2020 | Monroe | H01S 3/025 |
| 2020/0161529 A1 | 5/2020 | Chow et al. | |
| 2020/0234171 A1 | 7/2020 | Chu et al. | |
| 2020/0272929 A1 | 8/2020 | McKay et al. | |
| 2020/0313063 A1 | 10/2020 | Pollanen et al. | |
| 2020/0341837 A1 | 10/2020 | Cross et al. | |
| 2021/0099201 A1 | 4/2021 | Winick et al. | |
| 2021/0241159 A1 | 8/2021 | Heinsoo | |
| 2021/0256409 A1 | 8/2021 | Biercuk et al. | |
| 2021/0256410 A1 | 8/2021 | Bravyi et al. | |
| 2021/0258079 A1* | 8/2021 | Lauer | G06N 10/00 |
| 2023/0105436 A1 | 4/2023 | Du et al. | |

FOREIGN PATENT DOCUMENTS

| | | |
|---|---|---|
| CN | 111868755 A | 10/2020 |
| CN | 111915012 A | 11/2020 |
| CN | 112769554 A | 5/2021 |
| DE | 19525514 A1 | 1/1997 |
| WO | 2020/150348 A1 | 7/2020 |

OTHER PUBLICATIONS

Wei et al., "Quantum Crosstalk Cancellation for Fast Entangling Gates and Improved Multi-qubit Performance", arxiv:2106.00675v1, IBM Quantum, Jun. 1, 2021, 16 pages.

Temme, K. et al | "Error mitigation for short-depth quantum circuits." Physical review letters 119, No. 18 (2017):180509, 15 pages.

Magesan, E. et al. | "Effective Hamiltonian models of the cross-resonance gate." Physical Review A 101, No. 5 (2020): 052308, 16 pages.

Klimov, P.V. et al. | "Fluctuations of energy-relaxation times in superconducting qubits." Physical review letters 121, No. 9 (2018): 090502, 21 pages.

Kandala, A. et al. | "Error mitigation extends the computational reach of a noisy quantum processor." Nature 567, No. 7749 (2019): 491-495.

Mell et al., "The NIST Definition of Cloud Computing," Recommendations of the National Institute of Standards and Technology, NIST Special Publication 800-145, Sep. 2011, 7 pages.

Magesan et al., "Effective Hamiltonian models of the cross-resonance gate", arXiv:1804.04073v2 [quant-ph], Feb. 25, 2019, 16 pages.

DiCarlo et al., "Demonstration of Two-Qubit Algorithms with a Superconducting Quantum Processor," arXiv:0903.2030 [cond-mat.mes-hall], May 4, 2009, 9 pages.

Sundaresan et al., "Reducing unitary and spectator errors in cross resonance with optimized rotary echoes," arXiv:2007.02925v1 [quant-ph] Jul. 6, 2020, 22 pages.

Jurcevic et al., "Demonstration of quantum volume 64 on a superconducting quantum computing system," arXiv:2008.08571v2 [quant-ph] Sep. 4, 2020, 7 pages.

Hertzberg et al., "Laser-annealing Josephson junctions for yielding scaled-up superconducting quantum processors," arXiv:2009.00781v4 [quant-ph] Sep. 23, 2020, 16 pages.

Non-Final Office Action received for U.S. Appl. No. 18/461,589, dated Mar. 26, 2024, 35 pages.

Notice of Allowance received for U.S. Appl. No. 17/552,580 dated Feb. 1, 2024, 33 pages.

Notice of Allowance received for U.S. Appl. No. 17/526,837 dated Jun. 16, 2023, 34 pages.

List of IBM Patents or Applications Treated as Related—Appendix P (2 pages).

Non Final Office Action received for U.S. Appl. No. 17/526,837 dated Feb. 23, 2023, 32 pages.

International Search Report and Written Opinion received for International PCT Application Serial No. PCT/IB2022/057862 dated Nov. 28, 2022, 6 pages.

\* cited by examiner

STARK SHIFT CANCELLATION

BACKGROUND

The subject disclosure relates to qubits, and more specifically to Stark shift cancellation for qubits.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus, and/or computer program products that can facilitate Stark shift cancellation are described.

According to one or more embodiments, a system is provided. The system can comprise a control qubit that is coupled to a target qubit. In various aspects, the control qubit can be driven by a first tone, where the first tone can entangle the control qubit with the target qubit. In various instances, the control qubit can be driven by a second tone simultaneously with the first tone. In various cases, the second tone can have an opposite detuning sign than the first tone. In various aspects, the first tone can cause a Stark shift in an operational frequency of the control qubit, and the second tone can cancel the Stark shift.

According to one or more embodiments, a device is provided. The device can comprise a control qubit that is coupled to a target qubit. In various aspects, the control qubit can be driven by a first tone, where the first tone can cause a Stark shift in an operational frequency of the control qubit. In various instances, the control qubit can be driven by a second tone. In various cases, the second tone can counteract the Stark shift. In various cases, the second tone can have an opposite detuning sign than the first tone. In various cases, the second tone can be applied simultaneously with the first tone. In various cases, a first absolute value difference between a frequency of the first tone and the operational frequency of the control qubit can be less than an absolute value of an anharmonicity of the control qubit, and a second absolute value difference between a frequency of the second tone and the operational frequency of the control qubit can be less than the absolute value of the anharmonicity of the control qubit.

According to one or more embodiments, an apparatus is provided. The apparatus can comprise a qubit lattice. In various aspects, a control qubit in the qubit lattice can be driven by an entangling gate tone. In various instances, the control qubit can be driven by a Stark shift cancellation tone simultaneously with the entangling gate tone. In various cases, the Stark shift cancellation tone can have an opposite detuning sign than the entangling gate tone.

According to one or more embodiments, the above-described system, device, and/or apparatus can be implemented as methods.

DETAILED DESCRIPTION

Figure 1:
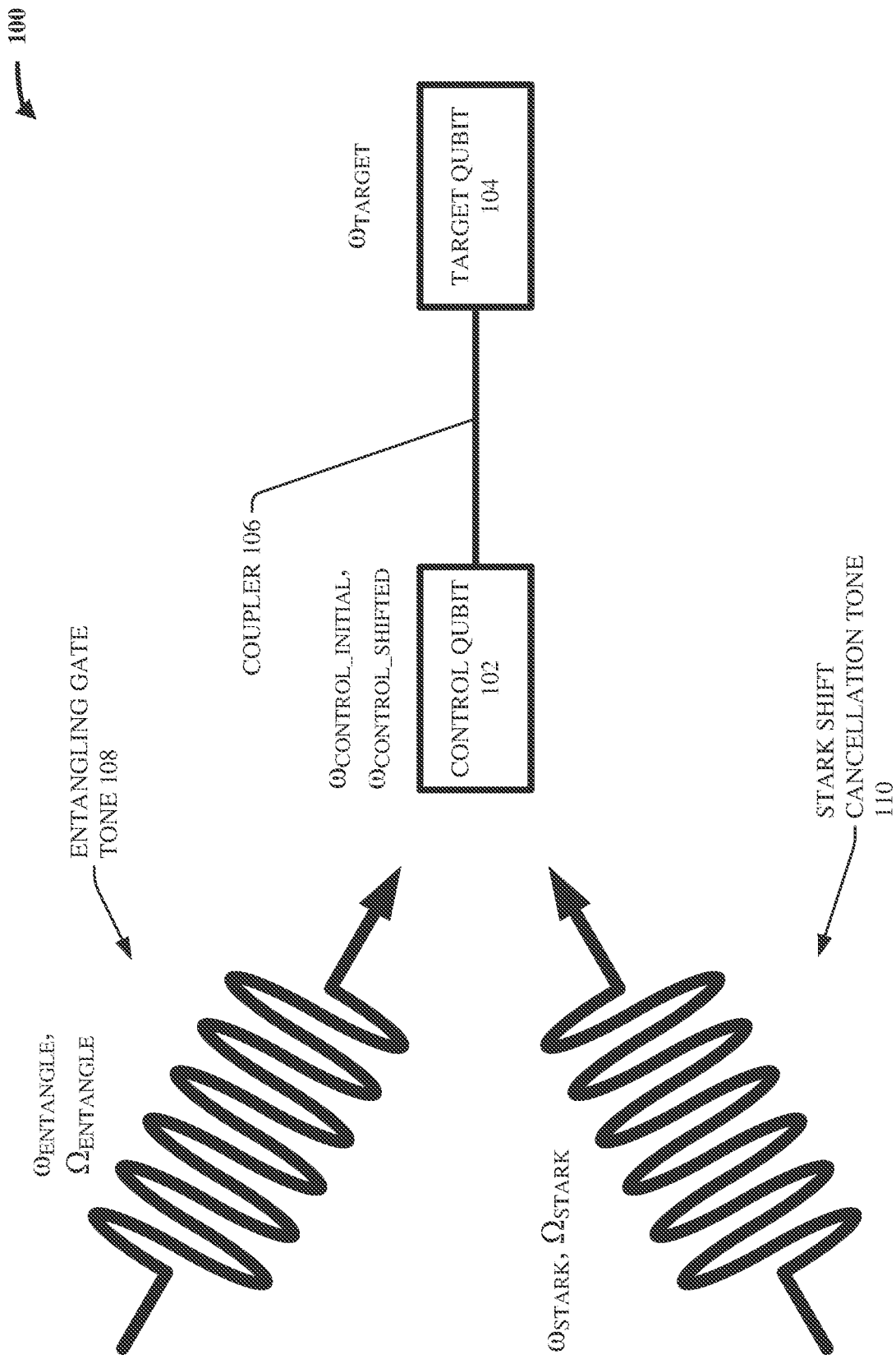
FIG. 1 illustrates a block diagram of an example, non-limiting system that facilitates Stark shift cancellation in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

The subject disclosure relates to quantum computing using quantum circuits. Quantum computing employs quantum physics to encode and process information rather than binary digital techniques based on transistors. A quantum computing device can employ quantum bits (also referred to as qubits) that operate according to the laws of quantum physics and can exhibit phenomena such as superposition and entanglement. The superposition principle of quantum physics allows qubits to be in a state that partially represent both a value of "1" and a value of "0" at the same time. The entanglement principle of quantum physics allows qubits to be correlated with each other such that the combined states of the qubits cannot be factored individual qubit states. For instance, a state of a first qubit can depend on a state of a second qubit. As such, a quantum circuit can employ qubits to encode and process information in a manner that can be significantly different from binary digital techniques based on transistors.

There are different types of qubits. One type of qubit can be a tunable frequency or flux tunable qubit that can comprise or be associated with a superconducting quantum interference device (SQUID) loop that can include a set of Josephson junctions to facilitate performing the functions of the SQUID loop. The frequency of a flux tunable qubit can be adjusted or tuned by changing the magnetic flux passing through the SQUID loop. Another type of qubit can be a fixed frequency qubit. A fixed frequency qubit can comprise a single Josephson junction, rather than a SQUID loop. In contrast to the tunable frequency or flux tunable qubit, which can have its frequency adjusted by changing the magnetic flux passing through the SQUID loop, a fixed frequency qubit can have a fixed frequency that typically cannot be readily or easily changed. The frequency of a fixed frequency qubit is generally stochastically determined by the details of the fabrication process utilized to create the fixed frequency qubit. Fixed frequency qubits can have the advantages of not having to have flux lines, and therefore, fixed frequency qubits can have less wiring or other circuitry or components in the cryostat, can have less control electronics for operation of such qubits than tunable frequency or flux tunable qubits, and are not susceptible to flux noise.

In the field of quantum computing, an entangling gate (e.g., a CNOT gate, a controlled Phase gate) can be applied to a control qubit by exposing the control qubit to (e.g., by driving the control qubit with) a microwave tone, where the microwave tone has a frequency that matches an operational frequency (e.g., a transition frequency) of a target qubit that is coupled to the control qubit. Such a microwave tone can be referred to as an off-resonant tone, since the frequency of the microwave tone does not match the operational frequency of the control qubit. Moreover, because the microwave tone can be applied to the control qubit and because the frequency of the microwave tone can match the operational frequency of the target qubit, the microwave tone can transform the states of both the control qubit and the target qubit, and such transformation can be determined by the amplitude and/or duration of the microwave tone. For instance, a given amplitude and/or duration can cause the microwave tone to perform a given gate (e.g., CNOT gate) on the control qubit and the target qubit, while a different amplitude and/or duration can cause the microwave tone to perform a different gate (e.g., controlled Phase gate) on the control qubit and the target qubit. In any case, although such a microwave tone can entangle the control qubit with the target qubit, such a microwave tone can also change the operational frequency of the control qubit, which change can be referred to as a Stark shift. In other words, driving the control qubit with an off-resonant tone can cause the operational frequency of the control qubit to shift upwards or downwards.

Stark shifts can be undesirable for various reasons. For example, Stark shifts can cause dynamic frequency collisions. In other words, when a control qubit experiences a Stark shift, the operational frequency of the control qubit can shift to a new value, and such new value might be equal to and/or within any suitable threshold margin of the operational frequency of a neighboring and/or spectating qubit. In such case, the shifted operational frequency of the control qubit can be considered as now being too close in magnitude to the operational frequency of the neighboring/spectating qubit, which means that the control qubit and the neighboring/spectating qubit can interfere with each other and/or can otherwise no longer be properly distinguishable for quantum computing purposes.

As another example, Stark shifts can impede zero-noise extrapolation. As those having ordinary skill in the art will appreciate, zero-noise extrapolation is an error mitigation technique that involves taking multiple measurements of a resulting quantum state (e.g., after application of one or more quantum gates of interest) at varying noise levels, so that a zero-noise limit can be identified via extrapolation. In practice, controllably varying the noise level of a quantum gate can be very difficult. Under the assumption of time-invariant noise, it has been shown that stretching a quantum gate in time by a certain factor (e.g., increasing the duration of the microwave tone that performs such quantum gate by the certain factor and appropriately recalibrating the amplitude of the microwave tone) can be considered as equivalent to amplifying the noise associated with that quantum gate by the same factor. Unfortunately, though, the Stark shift experienced by a control qubit can be a function of not only drive frequency, but also of drive amplitude. Thus, if zero-noise extrapolation is performed on a control qubit by iteratively stretching a quantum gate in time and by correspondingly rescaling the drive amplitude of the quantum gate, a different Stark shift can be experienced by the control qubit at each iteration (e.g., due to the re-scaled amplitude at each iteration), which can correspondingly cause the control qubit to have a vastly different relaxation time at each iteration. In other words, the time-invariant noise assumption can fail to hold true due to the presence of Stark shifts, which can cause zero-noise extrapolation to yield highly inaccurate results. This problem can be especially significant for superconducting qubits that interact with defect two-level systems.

Thus, systems and/or techniques that address one or more of these technical problems can be desirable.

Various embodiments of the invention can address one or more of these technical problems. Specifically, various embodiments of the invention can provide systems and/or techniques that can facilitate Stark shift cancellation. In particular, the present inventors recognized that the direction of a Stark shift that is experienced by a control qubit when being driven by a microwave tone can depend, in various cases, on a detuning sign of the microwave tone. That is, if the detuning of the microwave tone is positive, the control qubit can experience a Stark shift in one direction (e.g., the operational frequency of the control qubit can increase, or the operational frequency of the control qubit can instead decrease). In contrast, if the detuning of the microwave tone is instead negative, the control qubit can experience a Stark shift in the opposite direction (e.g., if a positive detuning sign causes the operational frequency of the control qubit to increase, then a negative detuning sign can cause the operational frequency of the control qubit to decrease; if a positive detuning sign causes the operational frequency of the control qubit to decrease, then a negative detuning sign can cause the operational frequency of the control qubit to increase). Accordingly, the present inventors realized that the Stark shift experienced by a control qubit being driving by a first microwave tone can be cancelled and/or nullified by simultaneously driving the control qubit with a second microwave tone, where the second microwave tone has an opposite detuning sign as compared to the first microwave tone. In other words, the first microwave tone can cause the operational frequency of the control qubit to move up or down), and the second microwave tone can cause the shifted operational frequency of the control qubit to move back down or back up. The result can be that the operational frequency of the control qubit has experienced no net change (and/or a net change that is smaller than any suitable threshold). In other words, the inventors of various embodiments described herein devised a technique that can eliminate and/or otherwise significantly reduce Stark shifts. Accordingly, dynamic frequency collisions that are caused by Stark shifts can likewise be eliminated and/or reduced, and zero-noise extrapolation that can be impeded by Stark shifts can be more accurately performed.

In particular, various embodiments described herein can include a control qubit that is coupled to a target qubit. In various aspects, the control qubit can be any suitable type of quantum computing structure and/or quantum computing architecture that can exhibit qubit behavior (e.g., that can take on a superposition of two basis states). For example, the control qubit can be a superconducting qubit (e.g., a phase qubit, a charge qubit, a flux qubit, a transmon qubit) that is made up of one or more Josephson junctions. As another example, the control qubit can be a spin qubit and/or a quantum dot. Similarly, the target qubit can be any suitable quantum computing structure and/or quantum computing architecture that can exhibit qubit behavior (e.g., can be a superconducting qubit, a spin qubit, and/or a quantum dot). In any case, the control qubit can have and/or exhibit a particular operational frequency (e.g., a particular transition frequency) and the target qubit can have and/or exhibit a different operational frequency (e.g., a different transitional frequency).

In various aspects, the control qubit can be coupled to the target qubit via any suitable quantum computing coupler. For example, in some cases, the quantum computing coupler can include one or more superconducting cables and/or wires that directly couple the control qubit to the target qubit. As another example, the quantum computing coupler can include one or more superconducting cables and/or wires that capacitively couple the control qubit to the target qubit. As still another example, the quantum computing coupler can include any suitable combination of the aforementioned.

In various instances, the control qubit can be driven by and/or otherwise exposed to a first microwave tone. More specifically and as those having ordinary skill in the art will appreciate, any suitable electronic control circuitry (e.g., waveform generators) can be coupled to the control qubit via a first drive line (e.g., a first superconducting cable/wire), the electronic control circuitry can generate the first microwave tone, and the first drive line can carry the first microwave tone from the electronic control circuitry to the control qubit. In various cases, the first microwave tone can be an entangling tone. In other words, the first microwave tone can perform a desired entangling gate (e.g., a CNOT gate, a controlled Phase gate) on the control qubit and the target qubit. To facilitate such entanglement, the frequency of the first microwave tone can be equal to (and/or within any suitable threshold margin of) the operational frequency of the target qubit, and the amplitude and/or duration of the first microwave tone can be calibrated to any suitable magnitudes so as to perform the desired entangling gate. So, if the operational frequency of the target qubit is lesser than the operational frequency of the control qubit, the first microwave tone can be considered as having a negative detuning sign (e.g., the frequency of the first microwave tone can be equal to the operational frequency of the target qubit, and so the difference between the frequency of the first microwave tone and the operational frequency of the control qubit can be a negative number). In contrast, if the operational frequency of the target qubit is greater than the operational frequency of the control qubit, the first microwave tone can be considered as having a positive detuning sign (e.g., the frequency of the first microwave tone can be equal to the operational frequency of the target qubit, and so the difference between the frequency of the first microwave tone and the operational frequency of the control qubit can be a positive number). In any case, upon being exposed to the first microwave tone, the control qubit can experience a first Stark shift, the direction of which can depend upon the detuning sign of the first microwave tone.

In various aspects, the control qubit can be further driven by and/or otherwise exposed to a second microwave tone. More specifically and as those having ordinary skill in the art will appreciate, any suitable electronic control circuitry (e.g., waveform generators) can be coupled to the control qubit via a second drive line (e.g., a second superconducting cable/wire), the electronic control circuitry can generate the second microwave tone, and the second drive line can carry the second microwave tone from the electronic control circuitry to the control qubit. In various instances, the second microwave tone can be applied to the control qubit simultaneously with (and/or within any suitable threshold time interval of) the first microwave tone. In various cases, the second microwave tone can be considered as a Stark shift cancellation tone. In other words, as described herein, the second microwave tone can cancel, nullify, and/or otherwise counteract the first Stark shift that is caused by the first microwave tone. To facilitate such cancellation, nullification, and/or counteracting, the second microwave tone can have a detuning sign that is opposite to the detuning sign of the first microwave tone. Accordingly, if the detuning sign of the first microwave tone is negative (e.g., if the frequency of the first microwave tone is below the operational frequency of the control qubit), then the detuning sign of the second microwave tone can be positive (e.g., the frequency of the second microwave tone can be set above the operational frequency of the control qubit). On the other hand, if the detuning sign of the first microwave tone is positive (e.g., if the frequency of the first microwave tone is above the operational frequency of the control qubit), then the detuning sign of the second microwave tone can be negative (e.g., the frequency of the second microwave tone can be set below the operational frequency of the control qubit). Thus, in various cases, upon being exposed to the second microwave tone, the control qubit can experience a second Stark shift, the direction of which can be opposite to the first Stark shift that is caused by the first microwave tone. In other words, the first microwave tone can cause the operational frequency of the control qubit to move in one direction (e.g., up), and the second microwave tone can cause the operational frequency of the control qubit to move in the opposite direction (e.g., down). Therefore, with proper amplitude calibration, the magnitude of the first Stark shift can be equal to (and/or within any suitable threshold margin of) the magnitude of the second Stark shift, with the result being that the second Stark shift undoes the first Stark shift. That is, when the second microwave tone is applied simultaneously with the first microwave tone, the control qubit can experience a net zero change in its operational frequency, meaning that it is as if the control qubit did not experience a Stark shift at all.

Thus, various embodiments described herein can be considered as a system and/or technique that can cancel and/or otherwise significantly reduce the magnitude of Stark shifts. Accordingly, dynamic frequency collisions that can be caused by Stark shifts can be avoided and/or lessened, and zero-noise extrapolation that can be impeded by Stark shifts can be more accurately performed.

Various embodiments of the invention can be employed to use hardware and/or software to solve problems that are highly technical in nature (e.g., to facilitate Stark shift cancellation), that are not abstract, that are not mere laws of nature, that are not mere natural phenomena, and that cannot be performed as a set of mental acts by a human. Instead, various embodiments described herein include tangible quantum computing structures/architectures and/or methodologies pertaining to such tangible quantum computing structures/architectures that can be implemented so as to reduce, mitigate, and/or ameliorate the technical problem of Stark shifts. Indeed, as mentioned above, Stark shifts can significantly impede the performance of zero-noise extrapolation (e.g., qubit interactions with defect two-level quantum systems in their frequency neighborhood can lead to variable relaxation times, and such relaxation times can experience significant variation due to Stark shifts). Moreover, as also mentioned above, Stark shifts can cause dynamic frequency collisions between a control qubit and one or more neighboring/spectating qubits. Unfortunately, existing systems/techniques do not offer any relief from the problem of Stark shifts.

In contrast, various embodiments described herein can address the problem of Stark shifts. Specifically, systems/techniques described herein can include driving a control qubit with a first microwave tone that entangles the control qubit with a target qubit that is coupled to the control qubit, and driving the control qubit with a second microwave tone simultaneously with the first microwave tone. In various instances, the second microwave tone can have a detuning sign that is opposite to the detuning sign of the first microwave tone. Accordingly, even though the first microwave tone can shift the operational frequency of the control qubit either up or down, the second microwave tone can shift the operational frequency of the control qubit in the opposite direction, with the result being that the operational frequency of the control qubit can experience a net zero change. In other words, the second microwave tone can be considered as cancelling and/or counteracting the Stark shift that is caused by the first microwave tone. Because various embodiments described herein can mitigate the problem of Stark shifts, such embodiments certainly constitute a concrete and tangible technical improvement in the field of quantum computing.

Moreover, it must be emphasized that various embodiments described herein are not directed to mere transitory signals and/or propagating waveforms. As explained herein, various embodiments of the invention can solve the technical problem of Starks shifts, which refer to changes in the operational frequency of a control qubit when the control qubit is driven by an off-resonant signal/tone. As described herein, the present inventors devised a solution to this technical problem, where such solution includes simultaneously driving the control qubit with another off-resonant signal/tone that has an opposite detuning sign. Accordingly, various embodiments of the invention cannot be intelligently explained without discussing/describing microwave tones/signals and/or controllable parameters (e.g., frequency, duration, amplitude) of such microwave tones/signals. Despite such description/discussion of microwave tones/signals, various embodiments of the invention are not directed to such microwave tones/signals without significantly more. Instead, such embodiments are directed to the concrete, tangible, and non-transitory quantum computing structures/architectures that generate and/or react to such microwave tones/signals (e.g., a control qubit coupled to a target qubit, wherein the control qubit can experience a Stark shift by being driven by a first tone, and wherein the Stark shift can be eliminated by simultaneously driving the control qubit with a second tone that has an opposite detuning sign as the first tone).

Furthermore, various embodiments of the invention can control tangible, hardware-based, and/or software-based devices based on the disclosed teachings. For example, embodiments of the invention can include tangible qubits (e.g., superconducting qubits made up of Josephson junctions) whose operational frequencies can be safeguarded from Stark shifts by the teachings described herein.

It should be appreciated that the figures and the herein disclosure describe non-limiting examples of various embodiments of the invention.

FIG. 1 illustrates a block diagram of an example, non-limiting system 100 that can facilitate Stark shift cancellation in accordance with one or more embodiments described herein.

In various embodiments, the system 100 can include a control qubit 102 and a target qubit 104. In various aspects, the control qubit 102 can be any suitable quantum computing structure and/or quantum computing architecture that can exhibit qubit behavior. For example, the control qubit 102 can be a superconducting qubit that is made up of one or more Josephson junctions, such as a flux qubit, a charge qubit, a phase qubit, a transmon qubit, and/or any suitable variation thereof. As another example, the control qubit 102 can be a spin qubit. As yet another example, the control qubit 102 can be a quantum dot. In any case, the control qubit 102 can exhibit an initial operational frequency having any suitable magnitude. For purposes of explanation, the initial operational frequency of the control qubit 102 can be denoted as $\omega_{control\_initial}$.

In various aspects, the target qubit 104 can be any suitable quantum computing structure and/or quantum computing architecture that can exhibit qubit behavior. For example, the target qubit 104 can be a superconducting qubit that is made up of one or more Josephson junctions, such as a flux qubit, a charge qubit, a phase qubit, a transmon qubit, and/or any suitable variation thereof. As another example, the target qubit 104 can be a spin qubit. As still another example, the target qubit 104 can be a quantum dot. In any case, the target qubit 104 can exhibit an operational frequency having any suitable magnitude. For purposes of explanation, the operational frequency of the target qubit 104 can be denoted as $\omega_{target}$. In various aspects, the initial operational frequency of the control qubit 102 can be different from the operational frequency of the target qubit 104. That is, $\omega_{control\_initial} \neq \omega_{target}$.

In some cases, the control qubit 102 can be the same type of qubit as the target qubit 104 (e.g., both can be transmon qubits). In other cases, the control qubit 102 can be a different type of qubit as the target qubit 104 (e.g., one can be a transmon qubit while the other can be a phase qubit).

In various aspects, the control qubit 102 can be coupled to the target qubit 104 via a coupler 106. In various instances, the coupler 106 can be any suitable quantum computing structure and/or quantum computing architecture that can electrically couple two qubits together. For example, the coupler 106 can be one or more superconducting wires that physically and/or directly attach the control qubit 102 to the target qubit 104. As another example, the coupler 106 can be one or more superconducting wires that capacitively attach the control qubit 102 to the target qubit 104. As yet another example, the coupler 106 can be one or more microwave resonators that physically and/or capacitively couple the control qubit 102 to the target qubit 104. In any case, the coupler 106 can electromagnetically couple the control qubit 102 to the target qubit 104, such that entanglement between the control qubit 102 and the target qubit 104 can be facilitated. Although FIG. 1 depicts the coupler 106 as being a straight, single path, this is a mere non-limiting example for case of illustration. Those having ordinary skill in the art will appreciate that the coupler 106 can exhibit any suitable shape, size, dimensions, and/or number of paths.

Although not explicitly shown in FIG. 1, those having ordinary skill in the art will appreciate that the control qubit 102, the target qubit 104, and the coupler 106 can be fabricated and/or manufactured on any suitable quantum computing substrate. For example, the control qubit 102, the target qubit 104, and the coupler 106 can be fabricated and/or manufactured on a silicon wafer. Furthermore, those having ordinary skill in the art will appreciate that the control qubit 102, the target qubit 104, and the coupler 106 can be fabricated and/or manufactured via any suitable microfabrication and/or nanofabrication techniques, such as photolithography, deposition, and/or double-angle evaporation.

In various embodiments, the control qubit 102 can be driven by an entangling gate tone 108. In various aspects, the entangling gate tone 108 can be any suitable microwave signal and/or microwave waveform that can entangle the control qubit 102 with the target qubit 104. In various instances, the entangling gate tone 108 can have any suitable frequency, denoted as $\omega_{entangle}$. In various cases, the entangling gate tone 108 can have any suitable amplitude, denoted as $\Omega_{entangle}$. Although not explicitly shown in FIG. 1, the entangling gate tone 108 can have any suitable duration. In order to facilitate entanglement between the control qubit 102 and the target qubit 104, the frequency of the entangling gate tone 108 can be equal to (and/or otherwise within any suitable threshold margin of) the operational frequency of the target qubit 104. That is, $\omega_{entangle}=\omega_{target}$.

As those having ordinary skill in the art will appreciate, the amplitude and/or duration of the entangling gate tone 108 can be controllably adjusted and/or modulated, so as to control the type of entanglement that is facilitated by the entangling gate tone 108. For example, in some cases, the amplitude and/or duration of the entangling gate tone 108 can be set to some specific values, which can cause the entangling gate tone 108 to perform a CNOT gate on the control qubit 102 and the target qubit 104. In other cases, the amplitude and/or duration of the entangling gate tone 108 can be set to some other specific values, which can cause the entangling gate tone 108 to perform a controlled Phase gate on the control qubit 102 and the target qubit 104. Accordingly, any suitable type of entangling operation can be achieved by controllably adjusting the amplitude and/or duration of the entangling gate tone 108.

Although not explicitly shown in FIG. 1, those having ordinary skill in the art will appreciate that there can be any suitable electronic control circuitry (e.g., arbitrary waveform generators) that is coupled to the control qubit 102 via a first drive line (e.g., any suitable superconducting wire). Thus, in various aspects, such electronic control circuitry can generate the entangling gate tone 108, and the first drive line can transmit and/or carry the entangling gate tone 108 to the control qubit 102.

In various aspects, the entangling gate tone 108 can cause the control qubit 102 to experience a Stark shift. In other words, upon being exposed to the entangling gate tone 108, the operational frequency of the control qubit 102 can change and/or shift from the initial operational frequency $\omega_{control\_initial}$ to a different operational frequency, denoted as $\omega_{control\_shifted}$. In particular, this Stark shift can be approximately defined by the following formula:

$$\omega_{control\_shifted} - \omega_{control\_initial} = \frac{\alpha_{control}}{2\Delta_{entagle}(\alpha_{control} - \Delta_{entagle})}(\Omega_{entagle})^2$$

where $\omega_{control\_shifted} - \omega_{control\_initial}$ represents the Stark shift experienced by the control qubit 102 in response to the entangling gate tone 108, where $\alpha_{control}$ represents an anharmonicity of the control qubit 102, and where $\Delta_{entangle}=\omega_{entangle}-\omega_{control\_initial}$ represents a detuning of the entangling gate tone 108. As can be seen from this formula, the sign of the Stark shift (e.g., whether $\omega_{control\_shifted}-\omega_{control\_shifted}>0$ or instead $\omega_{control\_shifted}-\omega_{control\_shifted}<0$) can depend upon the detuning sign of the entangling gate tone 108 (e.g., can depend on whether $\Delta_{entangle}>0$ or instead $\Delta_{entangle}<0$). Stated differently, the direction of the Stark shift (e.g., whether the Stark shift represents an increase or a decrease in operational frequency of the control qubit 102) can be a function of the sign of the difference between the frequency of the entangling gate tone 108 and the initial operational frequency of the control qubit 102 (e.g., can depend upon whether such difference is a positive number or a negative number). Thus, as described herein, the present inventors realized that the Stark shift that is caused by the entangling gate tone 108 can be cancelled and/or counteracted by applying another tone to the control qubit 102 that has an opposite detuning sign.

Specifically, in various embodiments, the control qubit 102 can be further driven by a Stark shift cancellation tone 110. In various aspects, the Stark shift cancellation tone 110 can be any suitable microwave signal and/or microwave waveform that can cancel, nullify, and/or otherwise counteract the Stark shift caused by the entangling gate tone 108. In various instances, the Stark shift cancellation tone 110 can have any suitable frequency, denoted as $\omega_{Stark}$. In various cases, the Stark shift cancellation tone 110 can have any suitable amplitude, denoted as $\Omega_{Stark}$. Although not explicitly shown in FIG. 1, the Stark shift cancellation tone 110 can have any suitable duration. Although not explicitly shown in FIG. 1, those having ordinary skill in the art will appreciate that there can be any suitable electronic control circuitry (e.g., arbitrary waveform generators) that is coupled to the control qubit 102 via a second drive line (e.g., any suitable superconducting wire). Thus, in various aspects, such electronic control circuitry can generate the Stark shift cancellation tone 110, and the second drive line can transmit and/or carry the Stark shift cancellation tone 110 to the control qubit 102.

In order to facilitate cancellation of, nullification of, and/or counteraction against the Stark shift that is caused by the entangling gate tone 108, the Stark shift cancellation tone 110 can be applied to the control qubit 102 simultaneously with (and/or within any suitable threshold time window of) the entangling gate tone 108. Furthermore, the frequency of the Stark shift cancellation tone 110 can be set to any suitable value, such that the sign of the detuning of the Stark shift cancellation tone 110 is opposite to the sign of the detuning of the entangling gate tone 108. That is, when given $\omega_{entangle}$ and $\omega_{control\_initial}$, a value of $\omega_{Stark}$ can be chosen such that:

$$(\omega_{Stark}-\omega_{control\_initial})(\omega_{entangle}-\omega_{control\_initial})<0$$

where ($\omega_{stark}-\omega_{control\_initial})=\Delta_{Stark}$ represents the detuning of the Stark shift cancellation tone 110, and where ($\omega_{entangle}-\omega_{control\_initial})=\Delta_{entangle}$ represents the detuning of the entangling gate tone 108.

More specifically, in various aspects, when the detuning sign of the Stark shift cancellation tone 110 is opposite to the detuning sign of the entangling gate tone 108 (e.g., when $\Delta_{Stark}\Delta_{entangle}<0$), this can cause the Stark shift cancellation tone 110 to shift the operational frequency of the control qubit 102 in a direction that is opposite to the direction in which the entangling gate tone 108 shifted the operational frequency of the control qubit 102. In other words, the entangling gate tone 108 can be considered as shifting $\omega_{control\_initial}$ to $\omega_{control\_shifted}$, and the Stark shift cancellation tone 110 can be considered as shifting $\omega_{control\_shifted}$ back to $\omega_{control\_initial}$. Accordingly, in various cases, when the Stark shift cancellation tone 110 is applied to the control qubit 102 simultaneously with the entangling gate tone 108, it can be as if the control qubit 102 experienced no net change in operational frequency.

Furthermore, since the Stark shift cancellation tone 110 can have an opposite detuning sign as compared to the entangling gate tone 108, it can be the case that the frequency of the Stark shift cancellation tone 110 is not equal to the frequency of the entangling gate tone 108 (e.g., $\omega_{Stark} \ne \omega_{entangle}$) and is thus also not equal to the operational frequency of the target qubit 104 (e.g., since $\omega_{entangle}=\omega_{target}$). Accordingly, the Stark shift cancellation tone 110 can refrain from causing unwanted entanglement between the control qubit 102 and the target qubit 104 (e.g., the Stark shift cancellation tone 110 can be considered as an off-resonant drive whose frequency does not match the operational frequency of the target qubit 104).

Figure 2:
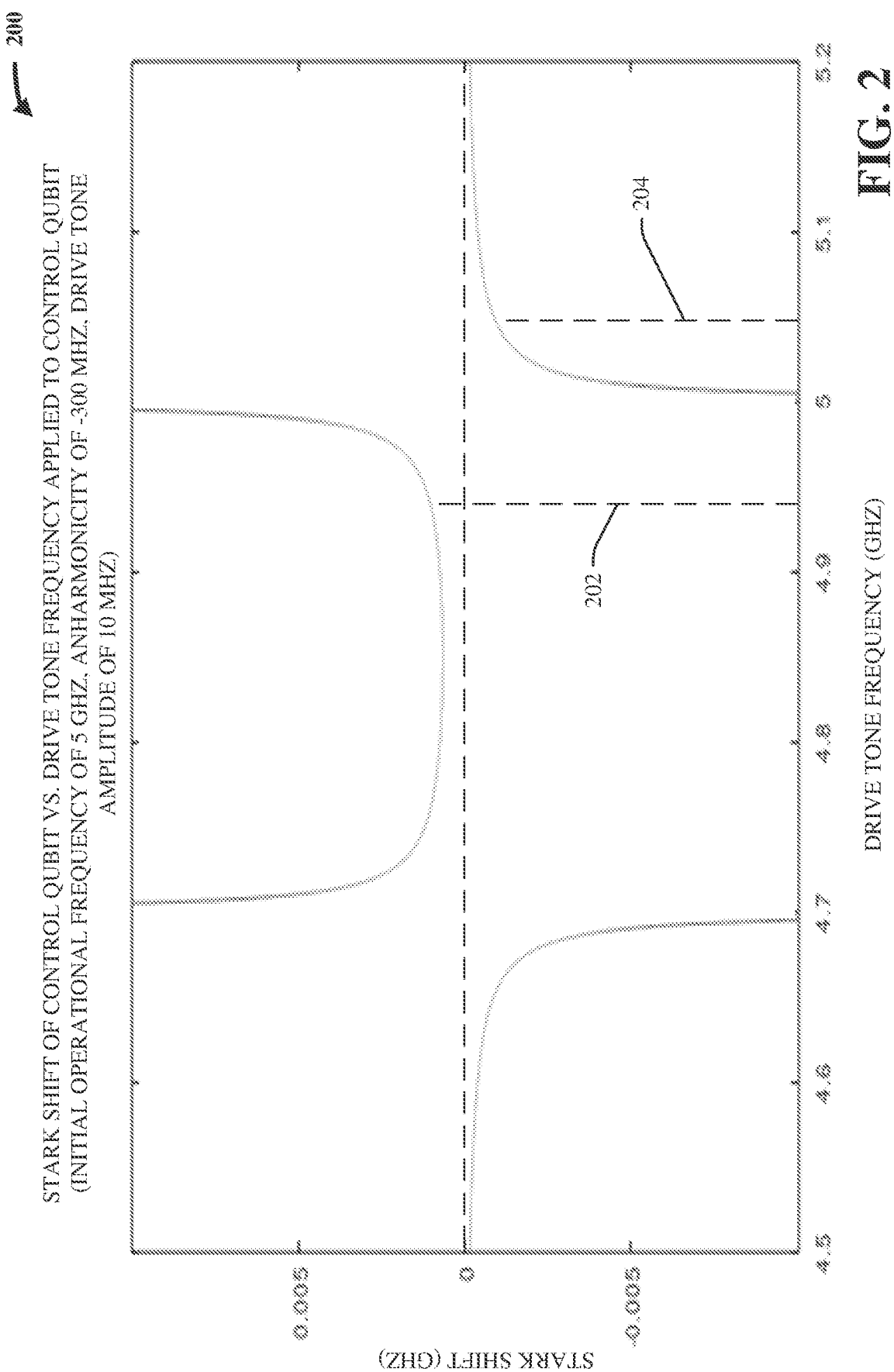
FIG. 2 illustrates an example, non-limiting graph showing Stark shift as a function of drive tone frequency in accordance with one or more embodiments described herein.

For additional clarification regarding how the Stark shift cancellation tone 110 can cancel and/or otherwise counteract the Stark shift caused by the entangling gate tone 108, consider FIG. 2.

FIG. 2 illustrates an example, non-limiting graph 200 showing Stark shift as a function of drive tone frequency in accordance with one or more embodiments described herein. In other words, the graph 200 can be considered as a plot of the Stark shift that is experienced by the control qubit 102 in response to a drive tone, where such plot can be given by:

$$f(\omega_{drive}) = -\frac{\alpha_{control}}{2\Delta_{drive}(\alpha_{control}-\Delta_{drive})}(\Omega_{drive})^2$$

where $f(\omega_{drive})$ represents the Stark shift in the operational frequency of a control qubit 102 when exposed to a particular drive tone, where $\alpha_{control}$ represents the anharmonicity of the control qubit 102, where $\Delta_{drive}=\omega_{drive}-\omega_{control\_initial}$ represents the detuning of the particular drive tone, where $\omega_{drive}$ represents the frequency of the particular drive tone, and where $\omega_{control\_initial}$ represents the operational frequency (e.g., transition frequency) of the control qubit 102 In the non-limiting example shown in FIG. 2, the control qubit 102 can have an anharmonicity of −300 mega-Hertz (MHZ), the control qubit 102 can have an operational frequency of 5 giga-Hertz (GHz), and the particular drive tone can have an amplitude of 10 MHz. It is to be understood that these are mere non-limiting example values.

As shown, the graph 200 depicts an asymptote at 5 GHZ and another asymptote at 4.7 GHZ. Here, the asymptote at 5 GHz can be caused by the term $\Delta_{drive}$ in the denominator of $f(\omega_{drive})$; that is, when the particular drive tone has a frequency of 5 GHZ in this non-limiting example, the detuning $\Delta_{drive}$ of the particular drive tone can be equal to zero. Furthermore, the asymptote at 4.7 GHZ can be caused by the term $(\alpha_{control}-\Delta_{drive})$ in the denominator of $f(\omega_{drive})$; that is, when the particular drive tone has a frequency of 4.7 GHZ in this non-limiting example, the quantity $(\alpha_{control}-\Delta_{drive})$ can be equal to zero.

As shown in this non-limiting example, the value of the Stark shift experienced by the control qubit 102 can be positive (e.g., the operational frequency of the control qubit 102 can increase) when the particular drive tone has a frequency between 4.7 GHZ and 5 GHZ (e.g., $f(\omega_{drive})>0$ when 4.7 GHZ<$\omega_{drive}$<5 GHZ), which corresponds to a negative detuning sign (e.g., such frequencies are lesser than the operational frequency of 5 GHZ). On the other hand, as shown in this non-limiting example, the value of the Stark shift experienced by the control qubit 102 can be negative (e.g., the operational frequency of the control qubit 102 can decrease) when the particular drive tone has a frequency that is greater than 5 GHZ (e.g., $f(\omega_{drive})<0$ when 5 GHZ<$\omega_{drive}$), which corresponds to a positive detuning sign (e.g., such frequencies are greater than the operational frequency of 5 GHZ).

Therefore, there exist various drive frequencies that can cause a positive Stark shift in the operational frequency of the control qubit 102, and there exist other drive frequencies that can cause a negative Stark shift in the operational frequency of the control qubit 102. Accordingly, if the entangling gate tone 108 causes a positive Stark shift in the operational frequency of the control qubit 102, the frequency of the Stark shift cancellation tone 110 can be chosen such that the Stark shift cancellation tone 110 causes a negative Stark shift in the operational frequency of the control qubit 102, with the result being no (and/or very little) net change in the operational frequency of the control qubit 102. Similarly, if the entangling gate tone 108 causes a negative Stark shift in the operational frequency of the control qubit 102, the frequency of the Stark shift cancellation tone 110 can be chosen such that the Stark shift cancellation tone 110 causes a positive Stark shift in the operational frequency of the control qubit 102, with the result being no (and/or very little) net change in the operational frequency of the control qubit 102.

Specifically, as can be seen from the graph 200, when the absolute value of the detuning of the entangling gate tone 108 is less than the absolute value of the anharmonicity of the control qubit 102 (e.g., when $|\Delta_{entangle}|<|\alpha_{control}|$), then the Stark shift cancellation tone 110 can be guaranteed to cause a Stark shift in the opposite direction as compared to the entangling gate tone 108 by: (1) selecting the frequency of the Stark shift cancellation tone 110 such that the Stark shift cancellation tone 110 has an opposite detuning sign as the entangling gate tone 108; and (2) selecting the frequency of the Stark shift cancellation tone 110 such that the absolute value of the detuning of the Stark shift cancellation tone 110 is less than the absolute value of the anharmonicity of the control qubit 102 (e.g., such that $|\Delta_{Stark}|<|\alpha_{control}|$). In other words, when given an $\omega_{entangle}$ where $|\Delta_{entangle}|<|\alpha_{control}|$, there exists at least one frequency having an opposite detuning sign as $\omega_{entangle}$ and that can counteract and/or cancel out the Stark shift caused by $\omega_{entangle}$, and such frequency can be chosen as $\omega_{Stark}$.

For example, suppose that the entangling gate tone 108 has a frequency given by the numeral 202. In such case, the entangling gate tone 108 can be considered as having a negative detuning value (e.g., the numeral 202 is less than the operational frequency of 5 GHZ). Furthermore, in such case, the entangling gate tone 108 can be considered as having a detuning value whose magnitude is less than the absolute value of the anharmonicity of the control qubit 102 (e.g., the numeral 202 is less than 300 MHz away from the operational frequency of 5 GHZ). Further still, in such case, the entangling gate tone 108 can be considered as a causing a positive Stark shift in the operational frequency of the control qubit 102 (e.g., the graph 200 is above zero at the numeral 202).

With these givens, there exists at least one frequency that can counteract and/or cancel out the positive Stark shift that is caused by the numeral 202. One such frequency can be the numeral 204. As shown, the frequency denoted by the numeral 204 has a positive detuning sign (e.g., the numeral 204 is greater than the operational frequency of 5 GHZ), which is of opposite sign as compared to the detuning of the numeral 202. Moreover, as shown, the numeral 204 can be considered as having a detuning whose magnitude is less than the absolute value of the anharmonicity of the control qubit 102 (e.g., the numeral 202 is less than 300 MHz away from the operational frequency of 5 GHZ). Furthermore, as shown, the numeral 204 can cause a negative Stark shift in the operational frequency of the control qubit 102 (e.g., the graph 200 is below zero at the numeral 204). Further still, as shown, the magnitude of the negative Stark shift caused by the numeral 204 can be equal to (and/or within any suitable margin of) the magnitude of the positive Stark shift that is caused by the numeral 202.

Accordingly, if the entangling gate tone 108 has a frequency that corresponds to the numeral 202, then the Stark shift cancellation tone 110 can have a frequency that corresponds to the numeral 204. In such case, the Stark shift cancellation tone 110 can be considered as causing a negative Stark shift which can counteract and/or cancel out the positive Stark shift caused by the entangling gate tone 108. Note that such cancellation and/or counteraction can be facilitated, notwithstanding that the absolute value of the detuning of the Stark shift cancellation tone 110 might be different than and/or not equal to the absolute value of the detuning of the entangling gate tone 108 (e.g., it can be the case that $|\Delta_{Stark}| \neq |\Delta_{entangle}|$).

In short, the graph 200 shows that, whenever the absolute value of the detuning of the entangling gate tone 108 is less than the absolute value of the anharmonicity of the control qubit 202, there exists a frequency that has an opposite detuning sign than the entangling gate tone 108 and that can cancel out and/or counteract the Stark shift caused by the entangling gate tone 108. Such frequency can be selected as the frequency for the Stark shift cancellation tone 110.

In various embodiments, any suitable calibration techniques can be implemented so as to create the entangling gate tone 108 and/or the Stark shift cancellation tone 110. For instance, as those having ordinary skill in the art will appreciate, the frequency of the entangling gate tone 108 can be set to be equal to the operational frequency of the target qubit 104 (e.g., to facilitate entanglement), and the amplitude and/or duration of the entangling gate tone 108 can be calibrated to any suitable values (e.g., so as to facilitate any desired transformation that is to be performed by the entangling gate). Moreover, as those having ordinary skill in the art will further appreciate, the frequency of the Stark shift cancellation tone 110 can be set to any suitable value that causes the Stark shift cancellation tone 110 to have an opposite detuning sign as the entangling gate tone 108, and the amplitude and/or duration of the Stark shift cancellation tone 110 can be experimentally swept until a particular amplitude and/or a particular duration are identified that cancel out the Stark shift caused by the entangling gate tone 108. This is further discussed with respect to FIG. 3.

Figure 3:
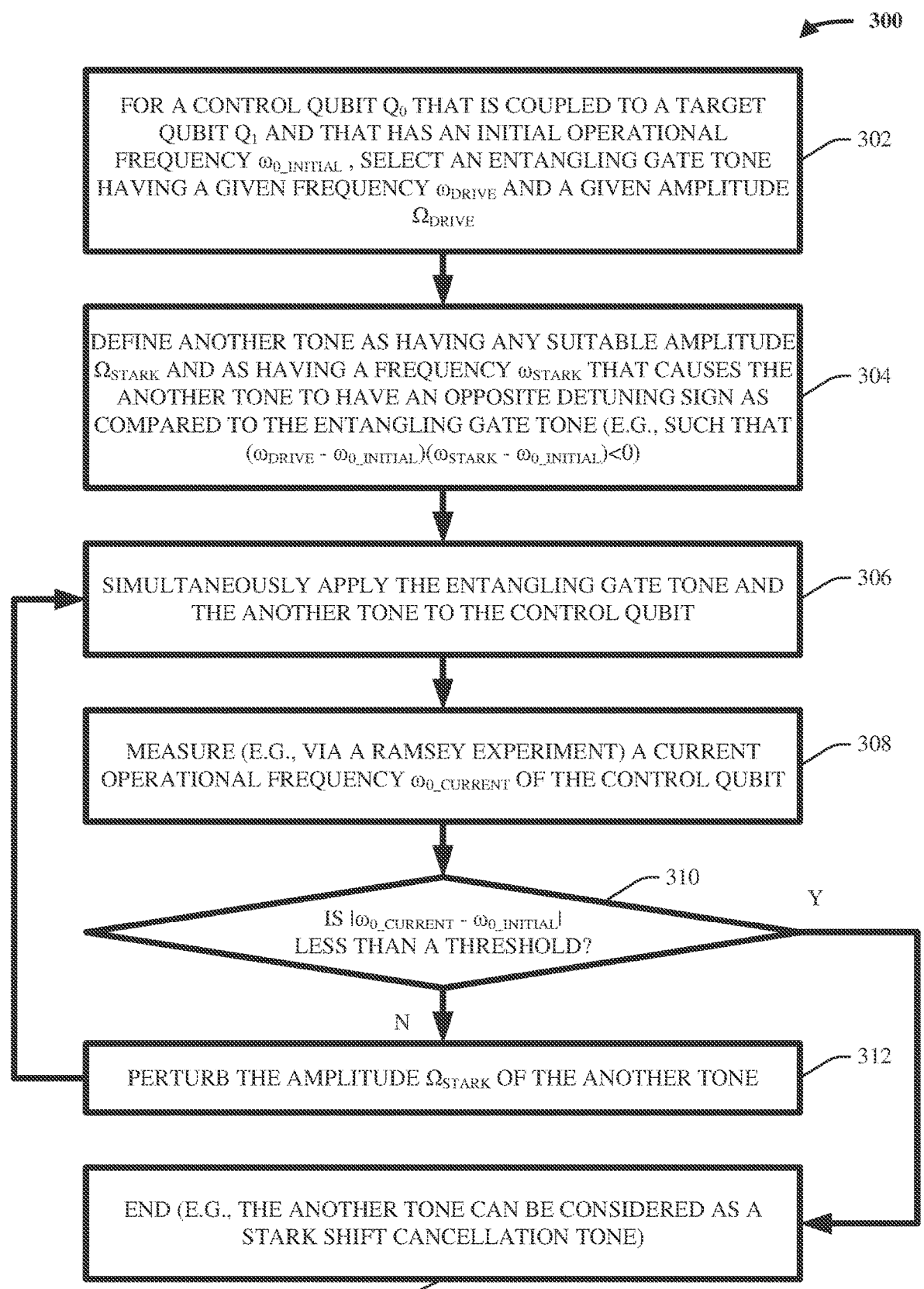
FIG. 3 illustrates a flow diagram of an example, non-limiting method that facilitates calibration of a Stark shift cancellation tone in accordance with one or more embodiments described herein.

FIG. 3 illustrates a flow diagram of an example, non-limiting method that can facilitate calibration of a Stark shift cancellation tone in accordance with one or more embodiments described herein.

In various embodiments, act 302 can include, for a control qubit $q_0$ (e.g., 102) that is coupled to a target qubit $q_1$ (e.g., 104) and that has an initial operational frequency $\omega_{0\_initial}$, selecting an entangling gate tone (e.g., 108) having a given frequency $\omega_{drive}$ and a given amplitude $\Omega_{drive}$.

In various aspects, act 304 can include defining another tone (e.g., 110) as having any suitable amplitude $\Omega_{Stark}$ and as having a frequency $\omega_{Stark}$ that causes the another tone to have an opposite detuning sign as compared to the entangling gate tone. In other words, the frequency $\omega_{Stark}$ can be chosen as any suitable value such that $(\omega_{Stark} - \omega_{0\_initial})(\omega_{drive} - \omega_{0\_initial}) < 0$.

In various instances, act 306 can include simultaneously applying the entangling gate tone and the another tone to the control qubit.

In various cases, act 308 can include measuring (e.g., such as via a Ramsey experiment) a current operational frequency $\omega_{0\_current}$ of the control qubit.

In various aspects, act 310 can include determining whether $|\omega_{0\_current} - \omega_{0\_initial}|$ is less than any suitable threshold value. That is, it can be determined whether $\omega_{0\_current} - \omega_{0\_initial}$ is sufficiently close to zero. If not, the method 300 can proceed to act 312. If so, the method 300 can proceed to act 314.

In various instances, act 312 can include perturbing the amplitude $\Omega_{Stark}$ of the another tone (and/or perturbing a duration of the another tone). Accordingly, the method 300 can proceed back to act 306.

In various cases, act 314 can include ending the method 300. In other words, at act 314, the another tone can be considered as a properly calibrated Stark shift cancellation tone. Although not explicitly shown in FIG. 3, act 314 can further include the performance of any suitable fine calibration on the entangling gate tone and/or the another tone (e.g., so as to correct any coherence errors to the entangling gate tone that introduction of the another tone might have caused).

In any case, acts 306-312 can iterate until $|\omega_{0\_current} - \omega_{0\_initial}|$ is sufficiently close to zero. As those having ordinary skill in the art will appreciate, such iteration/repetition can be considered as amplitude sweeping.

In various aspects, the method 300 can be considered as describing how to tune a given entangling gate tone so as to have a net-zero Stark shift.

The herein disclosure has so far described how the Stark shift cancellation tone 110 can be implemented so as to cancel and/or counteract a Stark shift caused by the entangling gate tone 108 (e.g., as shown in FIGS. 1-2) and how the Stark shift cancellation tone 110 can be calibrated (e.g., as shown in FIG. 3). Since the Stark shift cancellation tone 110 can eliminate Stark shifts in the operational frequency of the control qubit 102, zero-noise extrapolation can be accurately applied to the control qubit 102, and the control qubit 102 can avoid dynamic frequency collisions with neighboring qubits. These benefits are further described with respect to FIGS. 4-6.

First, consider zero-noise extrapolation. As mentioned above, and as those having ordinary skill in the art will appreciate, zero-noise extrapolation is an error-mitigation technique that involves iteratively performing a quantum gate at progressively increasing and/or decreasing levels of noise, so as to identify a zero-noise limit that is approached by the quantum gate. In practice, such varying noise levels can be accomplished by iteratively stretching a quantum gate in time by a set of stretching factors (e.g., a set of scalars) and appropriately recalibrating the amplitude of the quantum gate at each iteration. Unfortunately, Stark shifts can impede the accuracy of zero-noise extrapolation. Accordingly, in various embodiments, Stark shift cancellation can be implemented so as to improve the accuracy of zero-noise extrapolation. More specifically, whenever the quantum gate is stretched by a scaling factor, a corresponding Stark shift cancellation tone for that stretched quantum gate can be identified/calibrated, and such Stark shift cancellation tone can be simultaneously applied with the stretched quantum gate. This is further explained with respect to FIG. 4.

Figure 4:
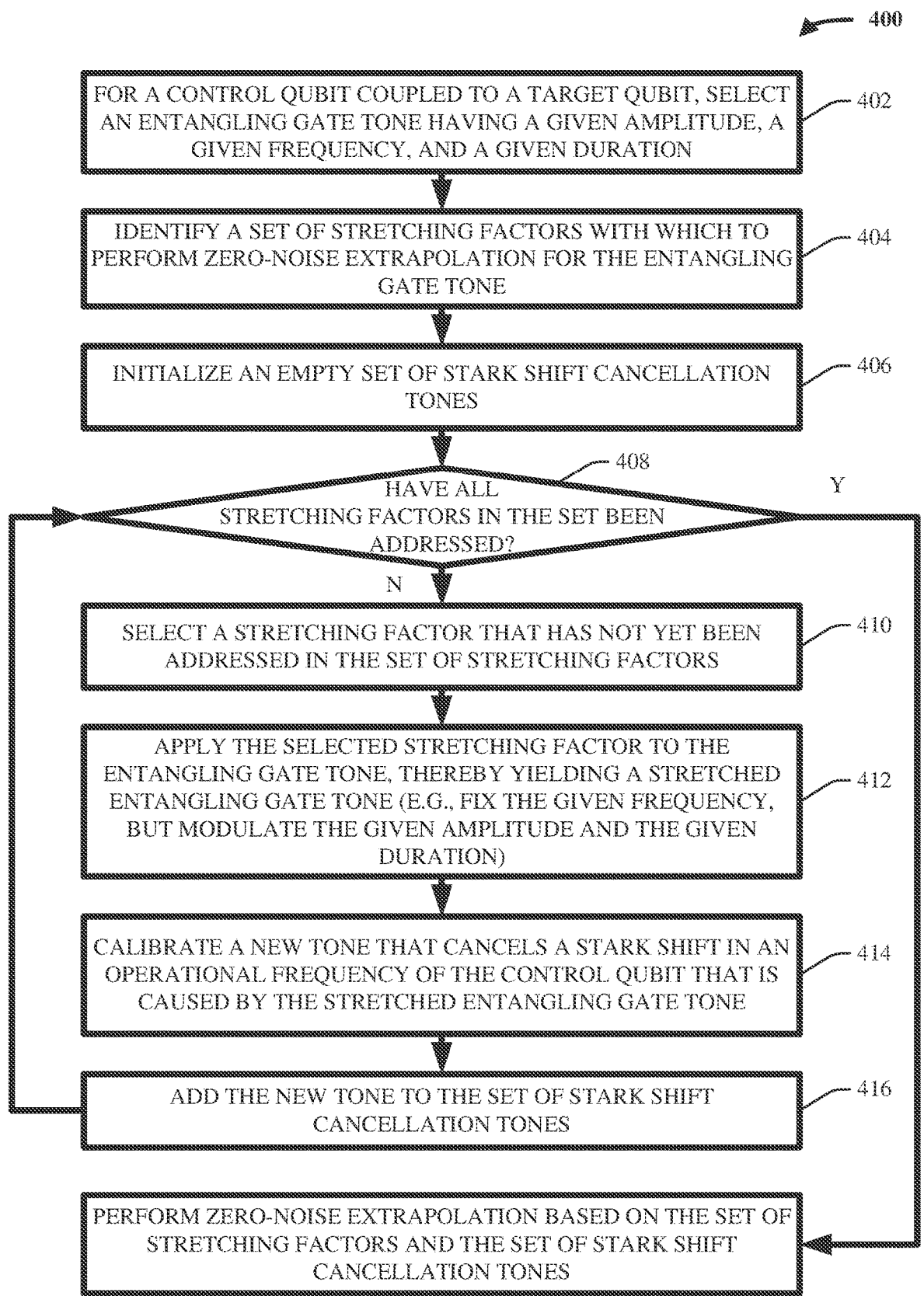
FIG. 4 illustrates a flow diagram of an example, non-limiting method that facilitates performing zero-noise extrapolation with Stark shift cancellation in accordance with one or more embodiments described herein.

FIG. 4 illustrates a flow diagram of an example, non-limiting method 400 that can facilitate performing zero-noise extrapolation with Stark shift cancellation in accordance with one or more embodiments described herein.

In various embodiments, act 402 can include, for a control qubit (e.g., 102) coupled to a target qubit (e.g., 104), selecting an entangling gate tone (e.g., 108) having a given amplitude, a given frequency, and/or a given duration.

In various aspects, act 404 can include identifying a set of stretching factors (e.g., a set of scalars) with which to perform zero-noise extrapolation for the entangling gate tone.

In various instances, act 406 can include initializing an empty set of Stark shift cancellation tones.

In various cases, act 408 can include determining whether all of the stretching factors in the set of stretching factors have been addressed yet (e.g., determining whether a respective Stark shift cancellation tone has been identified/calibrated for each of the set of stretching factors). If not, the method 400 can proceed to act 410. If so, the method 400 can proceed to act 418.

In various aspects, act 410 can include selecting a stretching factor that has not yet been addressed in the set of stretching factors (e.g., selecting a stretching factor for which a respectively corresponding Stark shift cancellation tone has not yet been identified/calibrated).

In various instances, act 412 can include applying the selected stretching factor to the entangling gate tone, thereby yielding a stretched entangling gate tone. As those having ordinary skill in the art will appreciate, this can include fixing the given frequency of the entangling gate tone to be equal to the operational frequency of the target qubit, stretching the given duration of the entangling gate tone by the stretching factor, and/or adjusting the given amplitude of the entangling gate tone so as to preserve the transformation performed by the entangling gate tone after stretching by the stretching factor.

In various cases, act 414 can include calibrating a new tone (e.g., 110) that cancels a Stark shift in an operational frequency of the control qubit that is caused by the stretched entangling gate tone. In various cases, such calibration can be facilitated as described with respect to FIG. 3.

In various aspects, act 416 can include adding the new tone to the set of Stark shift cancellation tones. In various cases, the method 400 can then proceed back to act 408.

In various instances, act 418 can include performing zero-noise extrapolation based on the set of stretching factors and based on the set of Stark shift cancellation tones. This can include: applying the set of stretching factors to the entangling gate tone, thereby yielding a set of stretched entangling gate tones; sequentially and/or iteratively driving the control qubit with the set of stretched entangling gate tones; and for each stretched entangling gate tone (e.g., for each iteration), simultaneously driving the control qubit with a respectively corresponding Stark shift cancellation tone from the set of Stark shift cancellation tones.

Figure 5:
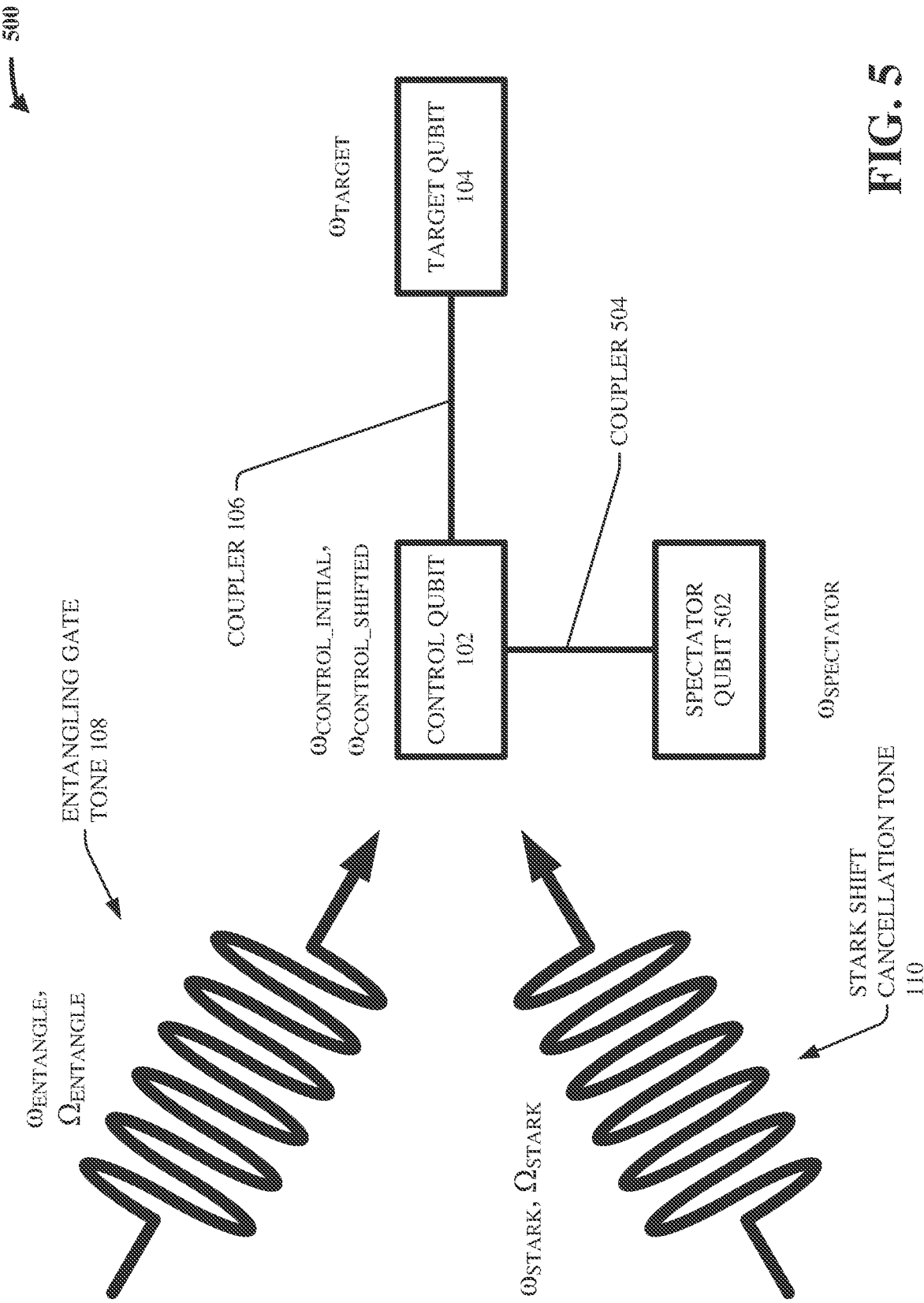
FIG. 5 illustrates a block diagram of an example, non-limiting system including a spectator qubit that facilitates Stark shift cancellation in accordance with one or more embodiments described herein.
Figure 6:
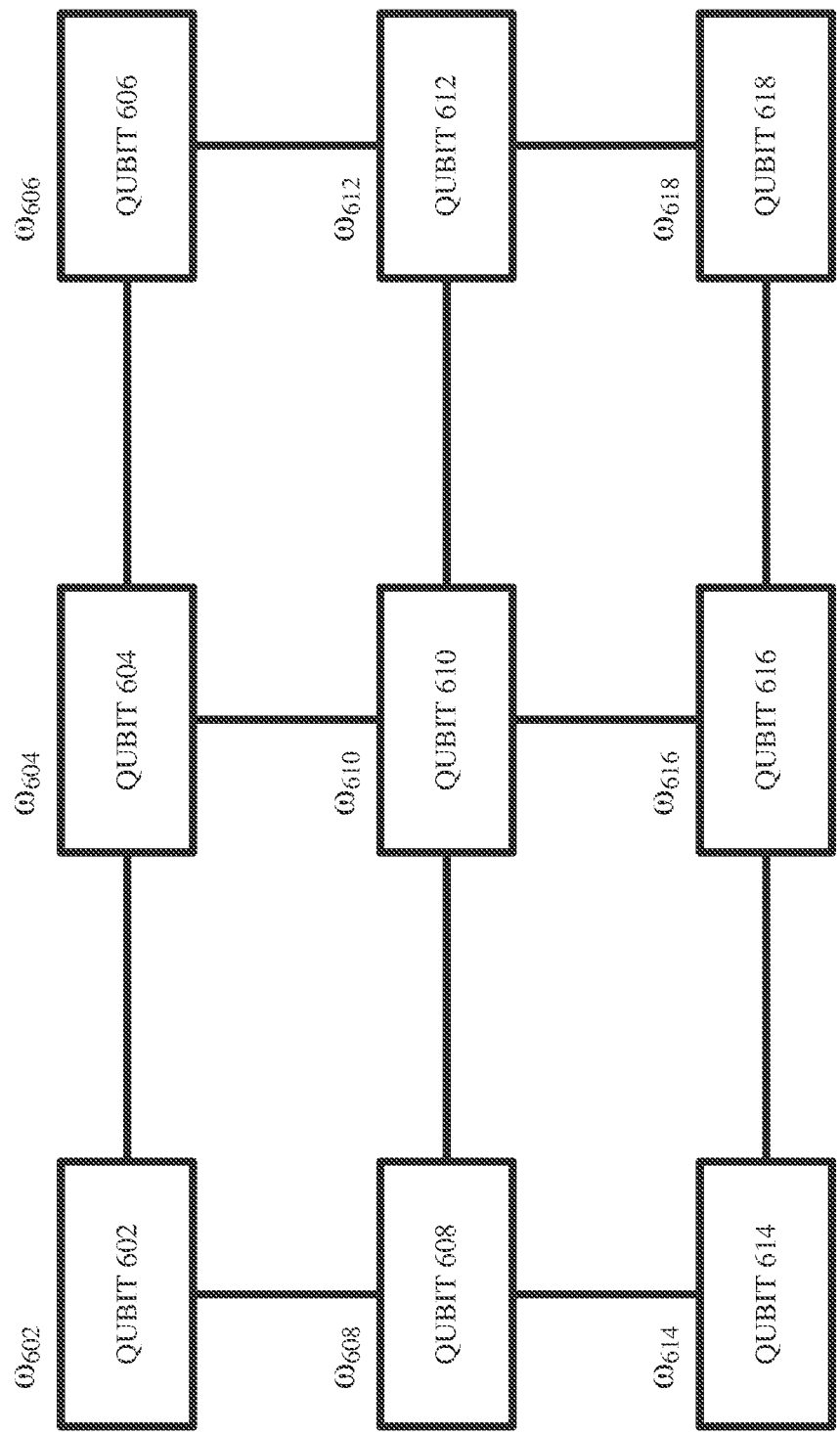
FIG. 6 illustrates a block diagram of an example, non-limiting system including a qubit lattice in which Stark shift cancellation can be applied in accordance with one or more embodiments described herein.

In addition to improving the accuracy of zero-noise extrapolation, Stark shift cancellation as described herein can be implemented to prevent dynamic frequency collisions, as shown in FIGS. 5-6.

FIG. 5 illustrates a block diagram of an example, non-limiting system 500 including a spectator qubit that can facilitate Stark shift cancellation in accordance with one or more embodiments described herein. As shown, the system 500 can include the same components as the system 100, and can further include a spectator qubit 502.

In various embodiments, the spectator qubit 502 can be any suitable quantum computing structure and/or quantum computing architecture that can exhibit qubit behavior. For example, the spectator qubit 502 can be a superconducting qubit that is made up of one or more Josephson junctions, such as a flux qubit, a charge qubit, a phase qubit, a transmon qubit, and/or any suitable variation thereof. As another example, the spectator qubit 502 can be a spin qubit. As yet another example, the spectator qubit 502 can be a quantum dot. In any case, the spectator qubit 502 can exhibit an operational frequency having any suitable magnitude. For purposes of explanation, the operational frequency of the spectator qubit 502 can be denoted as $\omega_{spectator}$. In various aspects, the operational frequency of the spectator qubit 502 can be different from the operational frequency of the control qubit 102 and/or can be different from the operational frequency of the target qubit 104, so as to avoid frequency collisions. That is, $\omega_{spectator} \neq \omega_{control\_initial}$ and $\omega_{spectator} \neq \omega_{target}$.

In some cases, the spectator qubit 502 can be the same type of qubit as the control qubit 102 and/or the target qubit 104. In other cases, the spectator qubit 502 can be a different type of qubit than the control qubit 102 and/or the target qubit 104.

In various aspects, the spectator qubit 502 can be coupled to the control qubit 102 via a coupler 504. In various instances, the coupler 504 can be any suitable quantum computing structure and/or quantum computing architecture that can electrically couple two qubits together. For example, the coupler 504 can be one or more superconducting wires that physically and/or directly attach the spectator qubit 502 to the control qubit 102. As another example, the coupler 504 can be one or more superconducting wires that capacitively attach the spectator qubit 502 to the control qubit 102. As yet another example, the coupler 504 can be one or more microwave resonators that physically and/or capacitively couple the spectator qubit 502 to the control qubit 102. In any case, the coupler 504 can electromagnetically couple the spectator qubit 502 to the control qubit 102, such that entanglement between the spectator qubit 502 and the control qubit 102 can be facilitated. Although FIG. 5 depicts the coupler 504 as being straight, single path, this is a mere non-limiting example for case of illustration. Those having ordinary skill in the art will appreciate that the coupler 504 can exhibit any suitable shape, size, dimensions, and/or number of paths.

Although not explicitly shown in FIG. 5, those having ordinary skill in the art will appreciate that the spectator qubit 502 can be fabricated and/or manufactured, via any suitable microfabrication and/or nanofabrication technique, on the same quantum substrate (e.g., silicon wafer) as the control qubit 102 and the target qubit 104.

In various aspects, suppose that $\omega_{spectator}=\omega_{control\_shifted}$. In other words, if the entangling gate tone 108 were applied to the control qubit 102 in the absence of the Stark shift cancellation tone 110, it can be the case that a dynamic frequency collision occurs between the control qubit 102 and the spectator qubit 502. In other words, it can be the case that the entangling gate tone 108 causes the operational frequency of the control qubit 102 to become equal to (and/or otherwise too close to) the operational frequency of the spectator qubit 502. However, when the entangling gate tone 108 is applied to the control qubit 102 simultaneously with the Stark shift cancellation tone 110, the operational frequency of the control qubit 102 can experience no (and/or very little) net change, which means that the operational frequency of the control qubit 102 can refrain from becoming equal to (and/or from otherwise getting too close to) the operational frequency of the spectator qubit 502. In this way, Stark shift cancellation can be implemented to prevent dynamic frequency collisions.

FIG. 6 illustrates a block diagram of an example, non-limiting system including a qubit lattice in which Stark shift cancellation can be applied in accordance with one or more embodiments described herein.

As shown, there can be a qubit lattice 600. In various aspects, the qubit lattice 600 can include any suitable number of any suitable types of qubits that are fabricated on any suitable quantum computing substrate (not shown). In the non-limiting example of FIG. 6, the qubit lattice 600 can include nine qubits: a qubit 602, a qubit 604, a qubit 606, a qubit 608, a qubit 610, a qubit 612, a qubit 614, a qubit 616, and a qubit 618.

In various aspects, each qubit in the qubit lattice can exhibit a respectively corresponding operational frequency. For instance, the qubit 602 can have an operational frequency $\omega_{602}$, the qubit 604 can have an operational frequency $\omega_{604}$, the qubit 606 can have an operational frequency $\omega_{606}$, the qubit 608 can have an operational frequency $\omega_{608}$, the qubit 610 can have an operational frequency $\omega_{610}$, the qubit 612 can have an operational frequency $\omega_{612}$, the qubit 614 can have an operational frequency $\omega_{614}$, the qubit 616 can have an operational frequency $\omega_{616}$, and the qubit 618 can have an operational frequency $\omega_{618}$.

In various instances, each qubit in the qubit lattice 600 can have a different operational frequency than any of its nearest neighboring qubits. For example, the qubit 610 can be considered as a having four nearest neighbors: the qubit 604, the qubit 608, the qubit 612, and the qubit 616. Accordingly, $\omega_{610}$ can be different in magnitude than $\omega_{604}$, $\omega_{608}$, $\omega_{612}$, and $\omega_{616}$. As another example, the qubit 614 can have two nearest neighbors: the qubit 608 and the qubit 616. So, $\omega_{614}$ can be different in magnitude than $\omega_{608}$ and $\omega_{616}$. As yet another example, the qubit 604 can have three nearest neighbors: the qubit 602, the qubit 606, and the qubit 610. Thus, $\omega_{604}$ can be different in magnitude than $\omega_{602}$, $\omega_{606}$, and $\omega_{610}$.

In various aspects, Stark shift cancellation can be implemented in the qubit lattice 600, so as to prevent dynamic frequency collisions. For instance, suppose that it is desired to treat the qubit 610 as a control qubit and the qubit 612 as a target qubit. In such case, the qubit 610 can be driven by an entangling gate tone have a frequency equal to (and/or within any suitable threshold margin of) $\omega_{612}$. Furthermore, the qubit 610 can be simultaneously driven by a Stark shift cancellation tone having an opposite detuning sign as compared to that entangling gate tone (e.g., such a Stark shift cancellation tone can be calibrated as described above with respect to FIG. 3). Accordingly, the entangling gate tone can cause a desired entanglement between the qubit 610 and the qubit 612, and the Stark shift cancellation tone can prevent the operational frequency of the qubit 610 (e.g., $\omega_{610}$) from experiencing a net shift. Thus, the Stark shift cancellation tone can be considered as preventing the operational frequency of the qubit 610 from colliding with the operational frequencies of the nearest neighbors of the qubit 610 (e.g., as preventing $\omega_{610}$ from becoming too close to $\omega_{604}$, $\omega_{608}$, $\omega_{612}$, or $\omega_{616}$).

As another example, suppose that it is desired to treat the qubit 608 as a control qubit and the qubit 614 as a target qubit. In such case, the qubit 608 can be driven by an entangling gate tone have a frequency equal to (and/or within any suitable threshold margin of) $\omega_{614}$. Furthermore, the qubit 608 can be simultaneously driven by a Stark shift cancellation tone having an opposite detuning sign as compared to that entangling gate tone (e.g., such a Stark shift cancellation tone can be calibrated as described above with respect to FIG. 3). Accordingly, the entangling gate tone can cause a desired entanglement between the qubit 608 and the qubit 614, and the Stark shift cancellation tone can prevent the operational frequency of the qubit 608 (e.g., $\omega_{608}$) from experiencing a net shift. Thus, the Stark shift cancellation tone can be considered as preventing the operational frequency of the qubit 608 from colliding with the operational frequencies of the nearest neighbors of the qubit 608 (e.g., as preventing $\omega_{608}$ from becoming too close to $\omega_{602}$, $\omega_{610}$, or $\omega_{614}$).

In this way, for any given pair of qubits in the qubit lattice 600 where one of such pair is a control qubit and the other of such pair is a target qubit, and for any given entangling gate that is desired to be applied to such pair of qubits, a unique Stark shift cancellation tone can be calibrated and applied to the control qubit simultaneously with the given entangling gate tone, so as to suppress a Stark shift caused by the entangling gate tone and thereby prevent dynamic frequency collisions in the qubit lattice 600. In some cases, a unique and/or distinct frequency can be used for each of such Stark shift cancellation tones. In other cases, however, a common frequency can be used for each of such Stark shift cancellation tones, with each of such Stark shift cancellation tones having a unique amplitude and/or duration. For example, if every control qubit in the qubit lattice 600 has an operational frequency that is greater than its desired target qubit, a single frequency that is greater than the highest operational frequency in the qubit lattice 600 can be chosen as the common frequency for each of the Stark shift cancellation tones. On the other hand, if every control qubit in the qubit lattice 600 has an operational frequency that is lesser than its desired target qubit, a single frequency that is lesser than the lowest operational frequency in the qubit lattice 600 can be chosen as the common frequency for each of the Stark shift cancellation tones. In either case, the common frequency can ensure that each Stark shift cancellation tone has an opposite detuning sign as compared to its corresponding entangling gate tone.

Although FIG. 6 illustrates the qubit lattice 600 as having a regular rectilinear arrangement, this is a mere non-limiting example. In various cases, the qubit lattice 600 can be arranged in any suitable fashion as desired.

Figure 7:
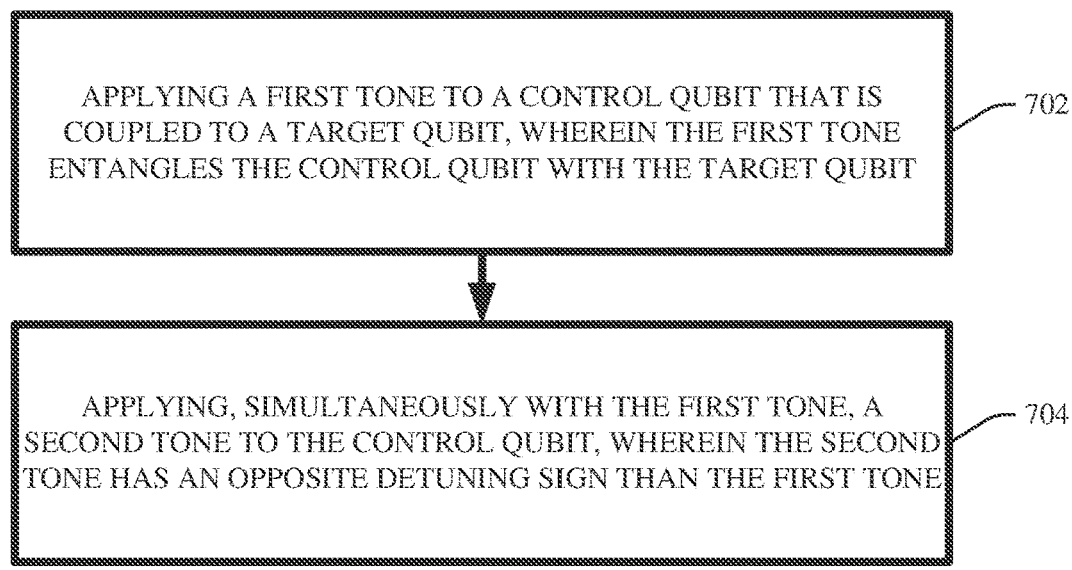
FIGS. 7-8 illustrate flow diagrams of example, non-limiting methods that facilitate Stark shift cancellation in accordance with one or more embodiments described herein.
Figure 8:
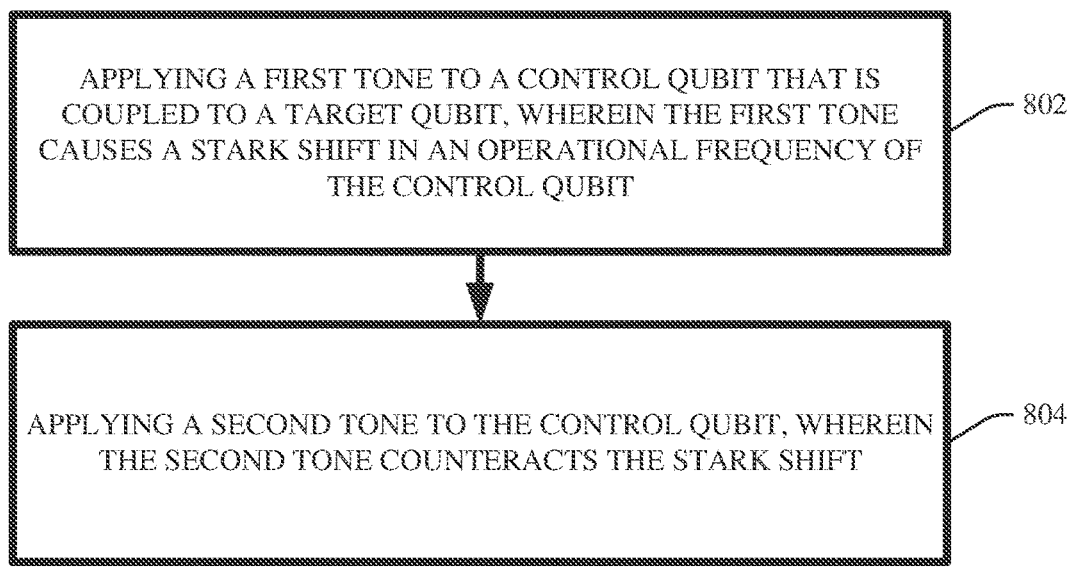

FIGS. 7-8 illustrate flow diagrams of example, non-limiting methods 700 and 800 that can facilitate Stark shift cancellation in accordance with one or more embodiments described herein.

First, consider the method 700. In various embodiments, act 702 can include applying a first tone (e.g., 108) to a control qubit (e.g., 102) that is coupled to a target qubit (e.g., 104). In various cases, the first tone can entangle the control qubit with the target qubit.

In various aspects, act 704 can include applying, simultaneously with the first tone, a second tone (e.g., 110) to the control qubit. In various cases, the second tone can have an opposite detuning sign than the first tone.

Although not explicitly shown in FIG. 7, the first tone can cause a Stark shift in an operational frequency of the control qubit (e.g., can cause $\omega_{control\_initial}$ to shift to $\omega_{control\_shifted}$), and the second tone can cancel the Stark shift (e.g., can cause $\omega_{control\_shifted}$ to shift back to $\omega_{control\_initial}$).

Although not explicitly shown in FIG. 7, the method 700 can further include: calibrating the second tone by fixing a frequency (e.g., $\omega_{Stark}$) of the second tone according to the opposite detuning sign and by sweeping an amplitude (e.g., $\Omega_{Stark}$) of the second tone until the Stark shift in the operational frequency of the control qubit is nullified (e.g., as described with respect to FIG. 3).

Although not explicitly shown in FIG. 7, a spectator qubit (e.g., 502) can be coupled to the control qubit, and the second tone can prevent the operational frequency of the control qubit from dynamically colliding with an operational frequency of the spectator qubit (e.g., $\omega_{spectator}$).

Although not explicitly shown in FIG. 7, the first tone can be one of a plurality of time-stretched tones being sequentially applied to the control qubit during a zero-noise extrapolation procedure (e.g., as described with respect to FIG. 4).

Now, consider FIG. 8. In various embodiments, act 802 can include applying a first tone (e.g., 108) to a control qubit (e.g., 102) that is coupled to a target qubit (e.g., 104). In various cases, the first tone can cause a Stark shift in an operational frequency of the control qubit (e.g., can cause $\omega_{control\_initial}$ to shift to $\omega_{control\_shifted}$).

In various aspects, act 804 can include applying a second tone (e.g., 110) to the control qubit. In various cases, the second tone can counteract the Stark shift (e.g., can cause $\omega_{control\_shifted}$ to shift back to $\omega_{control\_initial}$).

Although not explicitly shown in FIG. 8, the second tone can have an opposite detuning sign than the first tone.

Although not explicitly shown in FIG. 8, the second tone can be applied simultaneously with the first tone.

Although not explicitly shown in FIG. 8, a first absolute value difference between a frequency of the first tone and the operational frequency of the control qubit (e.g., an absolute value of the detuning of the first tone, $|\Delta_{entangle}|$) can be less than an absolute value of an anharmonicity (e.g., $|\alpha_{control}|$) of the control qubit, and a second absolute value difference between a frequency of the second tone and the operational frequency of the control qubit (e.g., an absolute value of the detuning of the second tone, $|\Delta_{Stark}|$) can be less than the absolute value of the anharmonicity of the control qubit.

Although not explicitly shown in FIG. 8, the second tone can prevent the operational frequency of the control qubit from colliding with an operational frequency of a neighboring qubit (e.g., 502).

Various embodiments described herein include systems and/or techniques for facilitating Stark shift cancellation. In particular, whenever an entangling gate tone is applied to a control qubit, a Stark shift cancellation tone can be simultaneously applied to the control qubit so as to cancel and/or undo a Stark shift that is caused by the entangling gate tone. Specifically, this can be facilitated by setting a frequency of the Stark shift cancellation tone so that the Stark shift cancellation tone has an opposite detuning sign as compared to the entangling gate tone (e.g., so that the detuning of the Stark shift cancellation tone is above zero and the detuning of the entangling gate tone is below zero, or so that the detuning of the Stark shift cancellation tone is below zero and the detuning of the entangling gate tone is above zero). Accordingly, for any desired entangling gate tone, a respectively corresponding Stark shift cancellation tone can be calibrated so as to tune the entangling gate tone to a net-zero Stark shift. Such Stark shift cancellation can prevent dynamic frequency collisions and can allow zero-noise extrapolation to be more accurately performed. Accordingly, various embodiments described herein certainly constitute a concrete and tangible technical improvement in the field of quantum computing.

Those having ordinary skill in the art will appreciate that the herein disclosure describes non-limiting examples of various embodiments of the subject innovation. For ease of description and/or explanation, various portions of the herein disclosure utilize the term "each" when discussing various embodiments of the subject innovation. Those having ordinary skill in the art will appreciate that such usages of the term "each" are non-limiting examples. In other words, when the herein disclosure provides a description that is applied to "each" of some particular object and/or component, it should be understood that this is a non-limiting example of various embodiments of the subject innovation, and it should be further understood that, in various other embodiments of the subject innovation, it can be the case that such description applies to fewer than "each" of that particular object and/or component.

Figure 9:
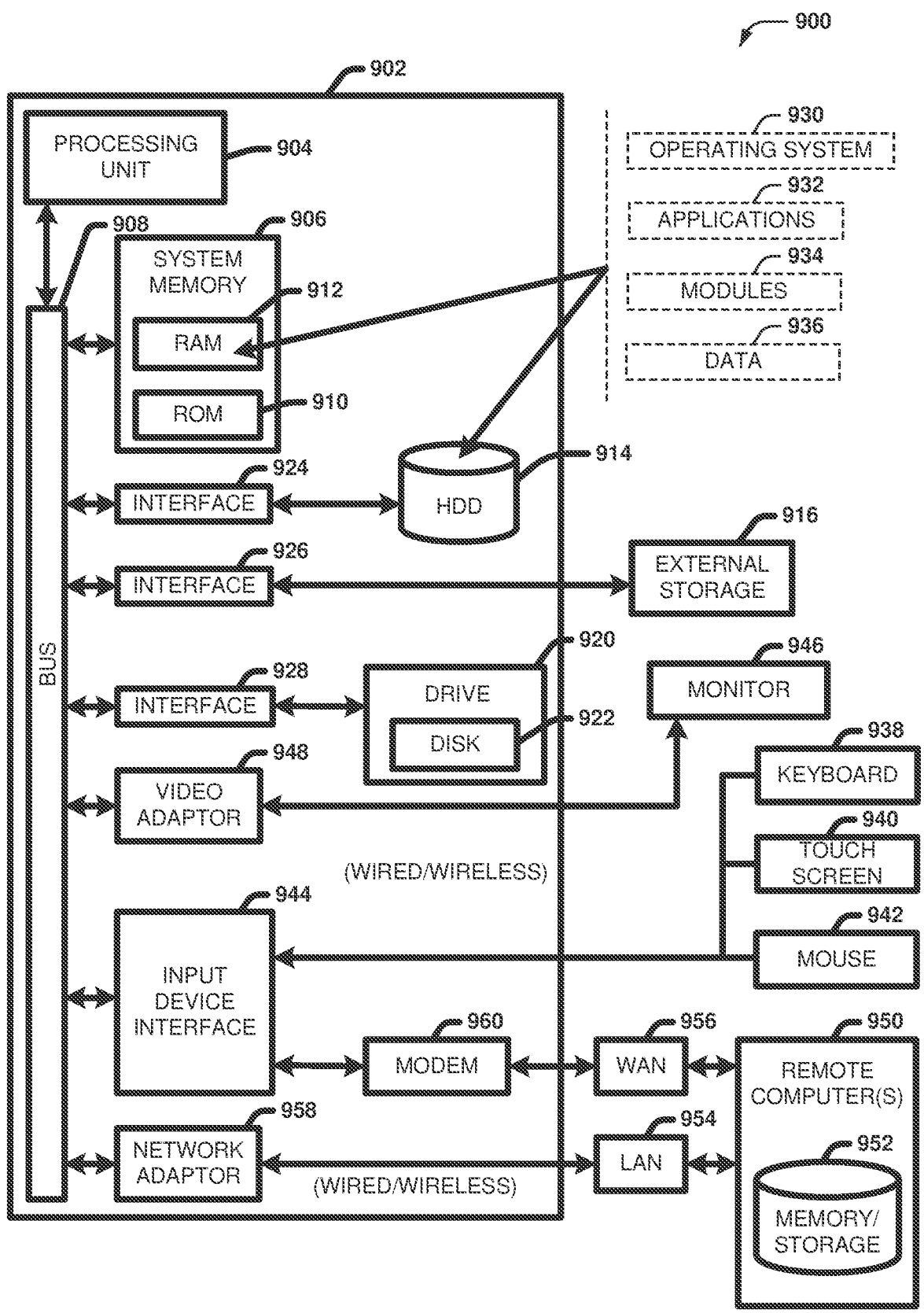
FIG. 9 illustrates a block diagram of an example, non-limiting operating environment in which one or more embodiments described herein can be facilitated.

In order to provide additional context for various embodiments described herein, FIG. 9 and the following discussion are intended to provide a brief, general description of a suitable computing environment 900 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multi-processor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 9, the example environment 900 for implementing various embodiments of the aspects described herein includes a computer 902, the computer 902 including a processing unit 904, a system memory 906 and a system bus 908. The system bus 908 couples system components including, but not limited to, the system memory 906 to the processing unit 904. The processing unit 904 can be any of various commercially available processors. Dual microprocessors and other multi-processor architectures can also be employed as the processing unit 904.

The system bus 908 can be any of several types of bus structure that can further interconnect to a memory bus (with or without a memory controller), a peripheral bus, and a local bus using any of a variety of commercially available bus architectures. The system memory 906 includes ROM 910 and RAM 912. A basic input/output system (BIOS) can be stored in a non-volatile memory such as ROM, erasable programmable read only memory (EPROM), EEPROM, which BIOS contains the basic routines that help to transfer information between elements within the computer 902, such as during startup. The RAM 912 can also include a high-speed RAM such as static RAM for caching data.

The computer 902 further includes an internal hard disk drive (HDD) 914 (e.g., EIDE, SATA), one or more external storage devices 916 (e.g., a magnetic floppy disk drive (FDD) 916, a memory stick or flash drive reader, a memory card reader, etc.) and a drive 920, e.g., such as a solid state drive, an optical disk drive, which can read or write from a disk 922, such as a CD-ROM disc, a DVD, a BD, etc. Alternatively, where a solid state drive is involved, disk 922 would not be included, unless separate. While the internal HDD 914 is illustrated as located within the computer 902, the internal HDD 914 can also be configured for external use in a suitable chassis (not shown). Additionally, while not shown in environment 900, a solid state drive (SSD) could be used in addition to, or in place of, an HDD 914. The HDD 914, external storage device(s) 916 and drive 920 can be connected to the system bus 908 by an HDD interface 924, an external storage interface 926 and a drive interface 928, respectively. The interface 924 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 902, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 912, including an operating system 930, one or more application programs 932, other program modules 934 and program data 936. All or portions of the operating system, applications, modules, and/or data can also be cached in the RAM 912. The systems and methods described herein can be implemented utilizing various commercially available operating systems or combinations of operating systems.

Computer 902 can optionally comprise emulation technologies. For example, a hypervisor (not shown) or other intermediary can emulate a hardware environment for operating system 930, and the emulated hardware can optionally be different from the hardware illustrated in FIG. 9. In such an embodiment, operating system 930 can comprise one virtual machine (VM) of multiple VMs hosted at computer 902. Furthermore, operating system 930 can provide runtime environments, such as the Java runtime environment or the .NET framework, for applications 932. Runtime environments are consistent execution environments that allow applications 932 to run on any operating system that includes the runtime environment. Similarly, operating system 930 can support containers, and applications 932 can be in the form of containers, which are lightweight, standalone, executable packages of software that include, e.g., code, runtime, system tools, system libraries and settings for an application.

Further, computer 902 can be enable with a security module, such as a trusted processing module (TPM). For instance with a TPM, boot components hash next in time boot components, and wait for a match of results to secured values, before loading a next boot component. This process can take place at any layer in the code execution stack of computer 902. e.g., applied at the application execution level or at the operating system (OS) kernel level, thereby enabling security at any level of code execution.

A user can enter commands and information into the computer 902 through one or more wired/wireless input devices, e.g., a keyboard 938, a touch screen 940, and a pointing device, such as a mouse 942. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 904 through an input device interface 944 that can be coupled to the system bus 908, but can be connected by other interfaces, such as a parallel port, an IEEE 1394 serial port, a game port, a USB port, an IR interface, a BLUETOOTH® interface, etc.

A monitor 946 or other type of display device can be also connected to the system bus 908 via an interface, such as a video adapter 948. In addition to the monitor 946, a computer typically includes other peripheral output devices (not shown), such as speakers, printers, etc.

The computer 902 can operate in a networked environment using logical connections via wired and/or wireless communications to one or more remote computers, such as a remote computer(s) 950. The remote computer(s) 950 can be a workstation, a server computer, a router, a personal computer, portable computer, microprocessor-based entertainment appliance, a peer device or other common network node, and typically includes many or all of the elements described relative to the computer 902, although, for purposes of brevity, only a memory/storage device 952 is illustrated. The logical connections depicted include wired/wireless connectivity to a local area network (LAN) 954 and/or larger networks, e.g., a wide area network (WAN) 956. Such LAN and WAN networking environments are commonplace in offices and companies, and facilitate enterprise-wide computer networks, such as intranets, all of which can connect to a global communications network, e.g., the Internet.

When used in a LAN networking environment, the computer 902 can be connected to the local network 954 through a wired and/or wireless communication network interface or adapter 958. The adapter 958 can facilitate wired or wireless communication to the LAN 954, which can also include a wireless access point (AP) disposed thereon for communicating with the adapter 958 in a wireless mode.

When used in a WAN networking environment, the computer 902 can include a modem 960 or can be connected to a communications server on the WAN 956 via other means for establishing communications over the WAN 956, such as by way of the Internet. The modem 960, which can be internal or external and a wired or wireless device, can be connected to the system bus 908 via the input device interface 944. In a networked environment, program modules depicted relative to the computer 902 or portions thereof, can be stored in the remote memory/storage device 952. It will be appreciated that the network connections shown are example and other means of establishing a communications link between the computers can be used.

When used in either a LAN or WAN networking environment, the computer 902 can access cloud storage systems or other network-based storage systems in addition to, or in place of, external storage devices 916 as described above, such as but not limited to a network virtual machine providing one or more aspects of storage or processing of information. Generally, a connection between the computer 902 and a cloud storage system can be established over a LAN 954 or WAN 956 e.g., by the adapter 958 or modem 960, respectively. Upon connecting the computer 902 to an associated cloud storage system, the external storage interface 926 can, with the aid of the adapter 958 and/or modem 960, manage storage provided by the cloud storage system as it would other types of external storage. For instance, the external storage interface 926 can be configured to provide access to cloud storage sources as if those sources were physically connected to the computer 902.

The computer 902 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

Figure 10:
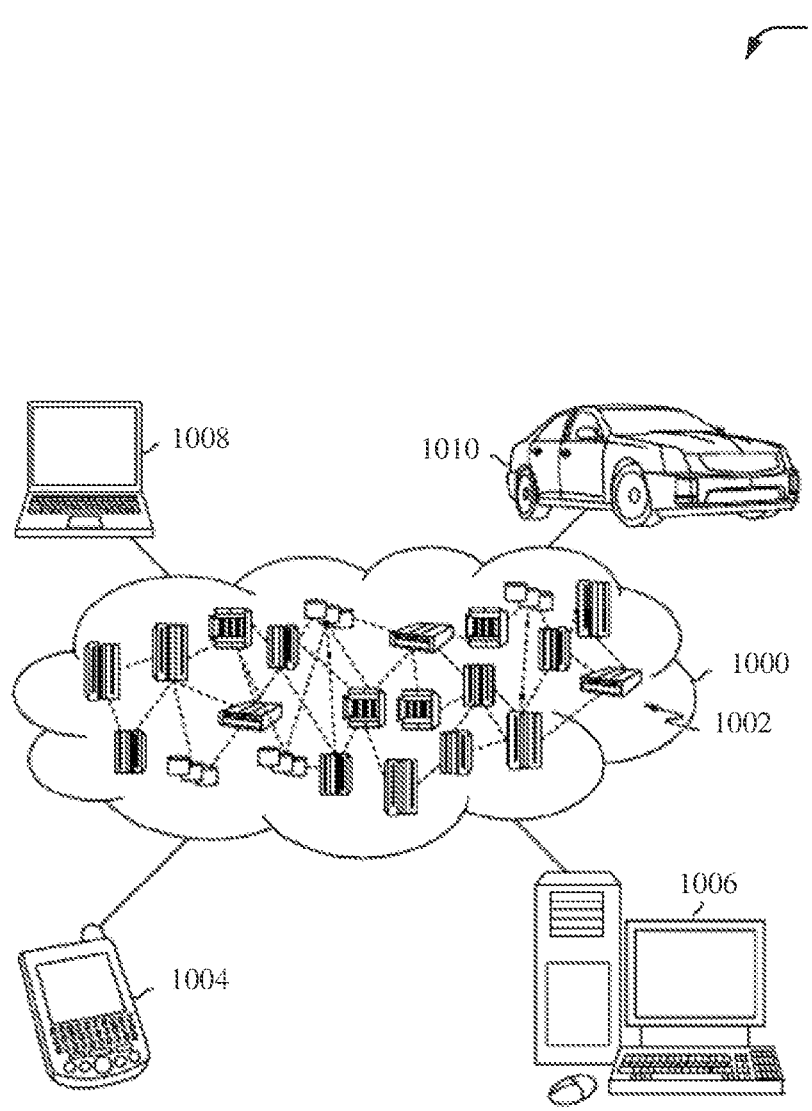
FIG. 10 illustrates an example, non-limiting cloud computing environment in accordance with one or more embodiments described herein.

Referring now to FIG. 10, illustrative cloud computing environment 1000 is depicted. As shown, cloud computing environment 1000 includes one or more cloud computing nodes 1002 with which local computing devices used by cloud consumers, such as, for example, personal digital assistant (PDA) or cellular telephone 1004, desktop computer 1006, laptop computer 1008, and/or automobile computer system 1010 may communicate. Nodes 1002 may communicate with one another. They may be grouped (not shown) physically or virtually, in one or more networks, such as Private, Community, Public, or Hybrid clouds as described hereinabove, or a combination thereof. This allows cloud computing environment 1000 to offer infrastructure, platforms and/or software as services for which a cloud consumer does not need to maintain resources on a local computing device. It is understood that the types of computing devices 1004-1010 shown in FIG. 10 are intended to be illustrative only and that computing nodes 1002 and cloud computing environment 1000 can communicate with any type of computerized device over any type of network and/or network addressable connection (e.g., using a web browser).

Figure 11:
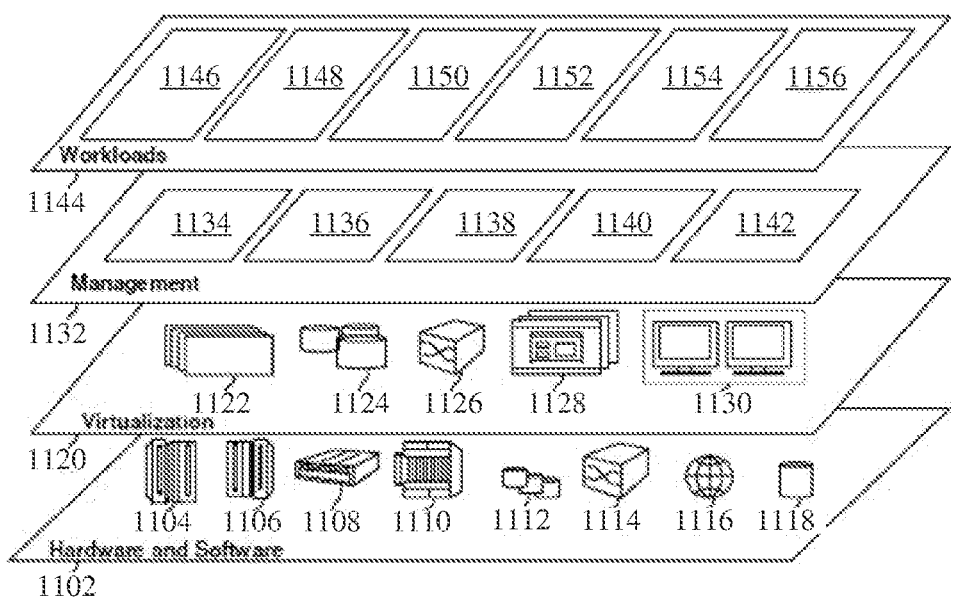
FIG. 11 illustrates example, non-limiting abstraction model layers in accordance with one or more embodiments described herein.

Referring now to FIG. 11, a set of functional abstraction layers provided by cloud computing environment 1000 (FIG. 10) is shown. Repetitive description of like elements employed in other embodiments described herein is omitted for sake of brevity. It should be understood in advance that the components, layers, and functions shown in FIG. 11 are intended to be illustrative only and embodiments of the invention are not limited thereto. As depicted, the following layers and corresponding functions are provided.

Hardware and software layer 1102 includes hardware and software components. Examples of hardware components include: mainframes 1104; RISC (Reduced Instruction Set Computer) architecture based servers 1106; servers 1108; blade servers 1110; storage devices 1112; and networks and networking components 1114. In some embodiments, software components include network application server software 1116 and database software 1118.

Virtualization layer 1120 provides an abstraction layer from which the following examples of virtual entities may be provided: virtual servers 1122; virtual storage 1124;

virtual networks 1126, including virtual private networks; virtual applications and operating systems 1128; and virtual clients 1130.

In one example, management layer 1132 may provide the functions described below. Resource provisioning 1134 provides dynamic procurement of computing resources and other resources that are utilized to perform tasks within the cloud computing environment. Metering and Pricing 1136 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1138 provides access to the cloud computing environment for consumers and system administrators. Service level management 1140 provides cloud computing resource allocation and management such that required service levels are met. Service Level Agreement (SLA) planning and fulfillment 1142 provide pre-arrangement for, and procurement of, cloud computing resources for which a future requirement is anticipated in accordance with an SLA.

Workloads layer 1144 provides examples of functionality for which the cloud computing environment may be utilized. Examples of workloads and functions which may be provided from this layer include: mapping and navigation 1146; software development and lifecycle management 1148; virtual classroom education delivery 1150; data analytics processing 1152; transaction processing 1154; and differentially private federated learning processing 1156. Various embodiments of the present invention can utilize the cloud computing environment described with reference to FIGS. 10 and 11 to execute one or more differentially private federated learning process in accordance with various embodiments described herein.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
a control qubit coupled to a target qubit, wherein the control qubit is driven by a first tone that entangles the control qubit with the target qubit; and
wherein the control qubit is driven by a second tone simultaneously with the first tone, wherein the second tone has an opposite detuning sign than the first tone.

2. The system of claim 1, wherein the first tone causes a Stark shift in an operational frequency of the control qubit, and wherein the second tone cancels the Stark shift.

3. The system of claim 2, wherein the second tone is calibrated by fixing a frequency of the second tone according to the opposite detuning sign and by sweeping an amplitude of the second tone until the Stark shift in the operational frequency of the control qubit is nullified.

4. The system of claim 2, further comprising:
a spectator qubit that is coupled to the control qubit, wherein the second tone prevents the operational frequency of the control qubit from dynamically colliding with an operational frequency of the spectator qubit.

5. The system of claim 1, wherein the first tone is one of a plurality of time-stretched tones being sequentially applied to the control qubit during a zero-noise extrapolation procedure.

6. A method, comprising:
applying a first tone to a control qubit that is coupled to a target qubit, wherein the first tone entangles the control qubit with the target qubit; and
applying, simultaneously with the first tone, a second tone to the control qubit, wherein the second tone has an opposite detuning sign than the first tone.

7. The method of claim 6, wherein the first tone causes a Stark shift in an operational frequency of the control qubit, and wherein the second tone cancels the Stark shift.

8. The method of claim 7, further comprising:
calibrating the second tone by fixing a frequency of the second tone according to the opposite detuning sign and by sweeping an amplitude of the second tone until the Stark shift in the operational frequency of the control qubit is nullified.

9. The method of claim 7, wherein a spectator qubit is coupled to the control qubit, and wherein the second tone prevents the operational frequency of the control qubit from dynamically colliding with an operational frequency of the spectator qubit.

10. The method of claim 6, wherein the first tone is one of a plurality of time-stretched tones being sequentially applied to the control qubit during a zero-noise extrapolation procedure.

11. A device, comprising:
a control qubit that is coupled to a target qubit, wherein the control qubit is driven by a first tone that causes a Stark shift in an operational frequency of the control qubit; and
wherein the control qubit is further driven by a second tone that counteracts the Stark shift.

12. The device of claim 11, wherein the second tone has an opposite detuning sign than the first tone.

13. The device of claim 12, wherein the second tone is applied simultaneously with the first tone.

14. The device of claim 13, wherein a first absolute value difference between a frequency of the first tone and the operational frequency of the control qubit is less than an absolute value of an anharmonicity of the control qubit, and wherein a second absolute value difference between a frequency of the second tone and the operational frequency of the control qubit is less than the absolute value of the anharmonicity of the control qubit.

15. The device of claim 11, wherein the second tone prevents the operational frequency of the control qubit from colliding with an operational frequency of a neighboring qubit.

16. A method, comprising:
applying a first tone to a control qubit that is coupled to a target qubit, wherein the first tone causes a Stark shift in an operational frequency of the control qubit; and
applying a second tone to the control qubit, wherein the second tone counteracts the Stark shift.

17. The method of claim 16, wherein the second tone has an opposite detuning sign than the first tone.

18. The method of claim 17, wherein the second tone is applied simultaneously with the first tone.

19. The method of claim 18, wherein a first absolute value difference between a frequency of the first tone and the operational frequency of the control qubit is less than an absolute value of an anharmonicity of the control qubit, and wherein a second absolute value difference between a frequency of the second tone and the operational frequency of the control qubit is less than the absolute value of the anharmonicity of the control qubit.

20. The method of claim 16, wherein the second tone prevents the operational frequency of the control qubit from colliding with an operational frequency of a neighboring qubit.

21. An apparatus, comprising:
a qubit lattice, wherein a control qubit in the qubit lattice is driven by an entangling gate tone; and
wherein the control qubit is driven by a Stark shift cancellation tone simultaneously with the entangling gate tone, wherein the Stark shift cancellation tone has an opposite detuning sign than the entangling gate tone.

22. The apparatus of claim 21, wherein the entangling gate tone increases an operational frequency of the control qubit, and wherein the Stark shift cancellation tone decreases the operational frequency of the control qubit.

23. The apparatus of claim 21, wherein the entangling gate tone decreases an operational frequency of the control qubit, and wherein the Stark shift cancellation tone increases the operational frequency of the control qubit.

24. The apparatus of claim 21, wherein a frequency of the Stark shift cancellation tone is greater than a highest operational frequency in the qubit lattice, thereby preventing an operational frequency of the control qubit from colliding with an operational frequency of a spectator qubit in the qubit lattice.

25. The apparatus of claim 21, wherein a frequency of the Stark shift cancellation tone is lesser than a lowest operational frequency in the qubit lattice, thereby preventing an operational frequency of the control qubit from colliding with an operational frequency of a spectator qubit in the qubit lattice.

* * * * *